US009692128B2

(12) United States Patent
Kato et al.

(10) Patent No.: US 9,692,128 B2
(45) Date of Patent: Jun. 27, 2017

(54) ANTENNA DEVICE AND WIRELESS COMMUNICATION DEVICE

(71) Applicant: Murata Manufacturing Co., Ltd., Nagaokakyo-shi, Kyoto-fu (JP)

(72) Inventors: Noboru Kato, Nagaokakyo (JP); Teppei Miura, Nagaokakyo (JP); Masahiro Ozawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 211 days.

(21) Appl. No.: 14/171,004

(22) Filed: Feb. 3, 2014

(65) Prior Publication Data
US 2014/0145906 A1 May 29, 2014

Related U.S. Application Data

(63) Continuation of application No. PCT/JP2013/054256, filed on Feb. 21, 2013.

(30) Foreign Application Priority Data

Feb. 24, 2012  (JP) .................. 2012-038238
Feb. 24, 2012  (JP) .................. 2012-038239

(51) Int. Cl.
H01Q 7/00 (2006.01)
H01Q 1/22 (2006.01)
H01Q 21/28 (2006.01)

(52) U.S. Cl.
CPC ............. H01Q 7/00 (2013.01); H01Q 1/2208 (2013.01); H01Q 21/28 (2013.01)

(58) Field of Classification Search
None
See application file for complete search history.

(56) References Cited

U.S. PATENT DOCUMENTS 3,364,564 A   1/1968   Kurtz et al.
4,794,397 A   12/1988  Ohe et al.
5,232,765 A   8/1993   Yano et al.
(Continued)

FOREIGN PATENT DOCUMENTS

CA       2 279 176 A1        7/1998
DE   10 2006 057 369 A1      6/2008
(Continued)

OTHER PUBLICATIONS

Official communication issued in Japanese Application No. 2007-531524, mailed on Sep. 11, 2007.
(Continued)

Primary Examiner — Robert Karacsony
(74) Attorney, Agent, or Firm — Keating & Bennett, LLP

(57) ABSTRACT

An antenna device includes a first coil antenna and a second coil antenna. The first coil antenna includes a coil conductor having a rectangular or substantially rectangular spiral shape and located on a non-magnetic insulating base member. The second coil antenna includes two coil conductors located on a non-magnetic insulating base member. The two coil conductors are disposed and wound such that loops of a magnetic field that is generated by applying a current to the two coil conductors are perpendicular or substantially perpendicular to a coil axis of the coil conductors.

17 Claims, 28 Drawing Sheets

(56) References Cited

U.S. PATENT DOCUMENTS

| | | |
|---|---|---|
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,821,525 A | 10/1998 | Takebayashi |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,104,611 A | 8/2000 | Glover et al. |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2002/0186004 A1 | 12/2002 | Prazeres da Costa et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2003/0206095 A1 | 11/2003 | Chaloner et al. |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0007296 A1 | 1/2005 | Endo et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0133605 A1 | 6/2005 | Koyama et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0162331 A1 | 7/2005 | Endo et al. |
| 2005/0232412 A1 | 10/2005 | Ichihara et al. |
| 2005/0236623 A1 | 10/2005 | Takechi et al. |
| 2005/0253726 A1 | 11/2005 | Yoshida et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0114159 A1 | 6/2006 | Yoshikawa et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0208900 A1 | 9/2006 | Tavassoli Hozouri |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0015549 A1 | 1/2007 | Hernandez et al. |
| 2007/0018893 A1 | 1/2007 | Kai et al. |
| 2007/0040028 A1 | 2/2007 | Kawamata |
| 2007/0051807 A1* | 3/2007 | Yamaguchi .......... G06K 7/0008 235/451 |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0122960 A1 | 5/2007 | Aoki |
| 2007/0132591 A1 | 6/2007 | Khatri |
| 2007/0164414 A1 | 7/2007 | Dokai et al. |
| 2007/0200705 A1 | 8/2007 | Yamagajo et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0252770 A1 | 11/2007 | Kai et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0074268 A1 | 3/2008 | Shafer |
| 2008/0087990 A1 | 4/2008 | Kato et al. |
| 2008/0111695 A1 | 5/2008 | Yamagajo et al. |
| 2008/0129606 A1 | 6/2008 | Yanagisawa et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0252551 A1 | 10/2008 | Kubo et al. |
| 2008/0272885 A1 | 11/2008 | Atherton |
| 2009/0002130 A1 | 1/2009 | Kato |
| 2009/0008460 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0066466 A1 | 3/2009 | Arimura |
| 2009/0080296 A1 | 3/2009 | Dokai et al. |
| 2009/0096696 A1 | 4/2009 | Joyce, Jr. et al. |
| 2009/0109034 A1 | 4/2009 | Chen et al. |
| 2009/0109102 A1 | 4/2009 | Dokai et al. |
| 2009/0134979 A1 | 5/2009 | Tsukamoto et al. |
| 2009/0140947 A1 | 6/2009 | Sasagawa et al. |
| 2009/0160719 A1 | 6/2009 | Kato et al. |
| 2009/0201116 A1 | 8/2009 | Orihara |

(56) References Cited

U.S. PATENT DOCUMENTS

| | | |
|---|---|---|
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0284220 A1 | 11/2009 | Toncich et al. |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0283694 A1 | 11/2010 | Kato |
| 2010/0308118 A1 | 12/2010 | Kataya et al. |
| 2011/0031320 A1 | 2/2011 | Kato et al. |
| 2011/0063184 A1 | 3/2011 | Furumura et al. |
| 2011/0080331 A1 | 4/2011 | Kato |
| 2011/0186641 A1 | 8/2011 | Kato et al. |
| 2011/0253795 A1 | 10/2011 | Kato |
| 2012/0001701 A1 | 1/2012 | Taniguchi et al. |
| 2012/0086556 A1* | 4/2012 | Ikemoto ........... G06K 19/07749 340/10.1 |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| GB | 2470299 A | 11/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-093029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 09-294374 A | 11/1997 |
| JP | 9-512367 A | 12/1997 |
| JP | 10-69533 A | 3/1998 |
| JP | 10-069533 A | 3/1998 |
| JP | 10-084406 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 2834584 B2 | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-048152 A | 2/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |

(56) References Cited

FOREIGN PATENT DOCUMENTS

| | | |
|---|---|---|
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-76750 A | 3/2002 |
| JP | 2002-076750 A | 3/2002 |
| JP | 2002-111363 A | 4/2002 |
| JP | 2002-143826 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-245416 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-290130 A | 10/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-324221 A | 11/2002 |
| JP | 2002-325013 A | 11/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-108966 A | 4/2003 |
| JP | 2003-110344 A | 4/2003 |
| JP | 2003-132330 A | 5/2003 |
| JP | 2003-134007 A | 5/2003 |
| JP | 2003-139866 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-308363 A | 10/2003 |
| JP | 2003-309418 A | 10/2003 |
| JP | 2003-317055 A | 11/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-506905 A | 3/2004 |
| JP | 2004-104344 A | 4/2004 |
| JP | 2004-121412 A | 4/2004 |
| JP | 2004-126750 A | 4/2004 |
| JP | 2004-127230 A | 4/2004 |
| JP | 2004-140513 A | 5/2004 |
| JP | 2004-145449 A | 5/2004 |
| JP | 2004-163134 A | 6/2004 |
| JP | 2004-166175 A | 6/2004 |
| JP | 2004-166176 A | 6/2004 |
| JP | 2004-172919 A | 6/2004 |
| JP | 2004-213582 A | 7/2004 |
| JP | 2004-519916 A | 7/2004 |
| JP | 2004/070879 A | 8/2004 |
| JP | 2004-234595 A | 8/2004 |

(56) References Cited

FOREIGN PATENT DOCUMENTS

| | | |
|---|---|---|
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-336604 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-006096 A | 1/2005 |
| JP | 2005-18156 A | 1/2005 |
| JP | 2005-033461 A | 2/2005 |
| JP | 2005-050581 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-134942 A | 5/2005 |
| JP | 2005-135132 A | 5/2005 |
| JP | 2005-136528 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-202943 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-327622 A | 11/2005 |
| JP | 2005-328259 A | 11/2005 |
| JP | 2005-333244 A | 12/2005 |
| JP | 2005-335755 A | 12/2005 |
| JP | 2005-340759 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-013976 A | 1/2006 |
| JP | 2006-13976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-013120 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-028002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-068073 A | 3/2007 |
| JP | 2007-79687 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-194924 A | 8/2007 |
| JP | 2007-524942 A | 8/2007 |
| JP | 2007-228254 A | 9/2007 |
| JP | 2007-228325 A | 9/2007 |
| JP | 2007-228437 A | 9/2007 |
| JP | 2007-233597 A | 9/2007 |
| JP | 2007-241789 A | 9/2007 |
| JP | 2007-249620 A | 9/2007 |
| JP | 2007-266999 A | 10/2007 |
| JP | 2007-272264 A | 10/2007 |
| JP | 2007-279782 A | 10/2007 |
| JP | 2007-287128 A | 11/2007 |
| JP | 2007-295177 A | 11/2007 |
| JP | 2007-295395 A | 11/2007 |

(56) References Cited

FOREIGN PATENT DOCUMENTS

| | | |
|---|---|---|
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042379 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-118359 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-182438 A | 8/2008 |
| JP | 2008-197714 A | 8/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-244739 A | 10/2008 |
| JP | 2008-252517 A | 10/2008 |
| JP | 2008-288915 A | 11/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-27291 A | 2/2009 |
| JP | 2009-027291 A | 2/2009 |
| JP | 2009-037413 A | 2/2009 |
| JP | 2009-044647 A | 2/2009 |
| JP | 2009-044715 A | 2/2009 |
| JP | 3148168 U | 2/2009 |
| JP | 2009-065426 A | 3/2009 |
| JP | 2009-110144 A | 5/2009 |
| JP | 2009-111950 A | 5/2009 |
| JP | 2009-111986 A | 5/2009 |
| JP | 2009-130896 A | 6/2009 |
| JP | 2009-135166 A | 6/2009 |
| JP | 2009-524363 A | 6/2009 |
| JP | 2009-153166 A | 7/2009 |
| JP | 4301346 B2 | 7/2009 |
| JP | 2009-181246 A | 8/2009 |
| JP | 2009-182630 A | 8/2009 |
| JP | 2009-213169 A | 9/2009 |
| JP | 2009-213171 A | 9/2009 |
| JP | 2009-260758 A | 11/2009 |
| JP | 2009-278441 A | 11/2009 |
| JP | 2009-284182 A | 12/2009 |
| JP | 2010-009196 A | 1/2010 |
| JP | 2010-015342 A | 1/2010 |
| JP | 2010-504598 A | 2/2010 |
| JP | 2010-050844 A | 3/2010 |
| JP | 2010-051012 A | 3/2010 |
| JP | 2010-051017 A | 3/2010 |
| JP | 2010-074839 A | 4/2010 |
| JP | 2010-081571 | 4/2010 |
| JP | 2010-102445 A | 5/2010 |
| JP | 2010-171857 A | 8/2010 |
| JP | 4535209 B2 | 9/2010 |
| JP | 4561932 B2 | 10/2010 |
| JP | 2010-268306 A | 11/2010 |
| JP | 2010-279029 A | 12/2010 |
| JP | 2011-015395 A | 1/2011 |
| JP | 4609604 B2 | 1/2011 |
| JP | 2011-076567 A | 4/2011 |
| JP | 2011-139533 A | 7/2011 |
| JP | 2011-142648 A | 7/2011 |
| JP | 2011-205384 A | 10/2011 |
| JP | 2012-033021 A | 2/2012 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/049068 A1 | 5/2006 |
| WO | 2006/114821 A1 | 11/2006 |
| WO | 2007/013168 A1 | 2/2007 |
| WO | 2007/060792 A1 | 5/2007 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/099602 A1 | 9/2007 |
| WO | 2007/100092 A1 | 9/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/001561 A1 | 1/2008 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/005080 A1 | 1/2009 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |
| WO | 2010/104179 A1 | 9/2010 |
| WO | 2010/119854 A1 | 10/2010 |
| WO | 2011/062274 A1 | 5/2011 |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags)", RFID, pp. 112-126.

(56) References Cited

OTHER PUBLICATIONS

Dokai et al.: "Wireless IC Device, and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2008/063025, mailed on Aug. 12, 2008.
Kato et al.: "Wireless IC Device," ; U.S. Appl. No. 12/603,608, filed Oct. 22, 2009.
Kato et al.: "Wireless IC Device," ; U.S. Appl. No. 12/688,072, filed Jan. 15, 2010.
Official Communication issued in International Patent Application No. PCT/JP2009/053693, mailed on Jun. 9, 2009.
Kato: "Composite Antenna,"; U.S. Appl. No. 12/845,846, filed Jul. 29, 2010.
Official Communication issued in International Patent Application No. PCT/JP2009/055758, mailed on Jun. 23, 2009.
Kato et al.: "Radio Freequency IC Device and Radio Communications System,"; U.S. Appl. No. 12/859,340, filed Aug. 19, 2010.
Kato et al.: "Wireless IC Device,"; U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device,"; U.S. Appl. No. 12/861,945, filed Aug. 24, 2010.
Kato: "Wireless IC Device and Electromagnetic Coupling Module,"; U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official communication issued in counterpart International Application No. PCT/JP2008/071502, mailed Feb. 24, 2009.
Kato et al.: "Wireless IC Device and Manufacturing Method Thereof,"; U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/055567, mailed May 20, 2008.
Ikemoto et al.: "Wireless IC Device and Electronic Apparatus,"; U.S. Appl. No. 12/503,188, filed Jul. 15, 2009.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices using the same", U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official Communication issued in International Patent Application No. PCT/JP2012/072849, mailed on Nov. 20, 2012.
Kimura et al.: "Wireless Communication Device"; U.S. Appl. No. 14/082,435, filed Nov. 18, 2013.
Kato: "Antenna Device and Wireless Device"; U.S. Appl. No. 14/085,830, filed Nov. 21, 2013.
Kato et al.: "Wireless IC Device Component and Wireless IC Device"; U.S. Appl. No. 14/151,852, filed Jan. 10, 2014.

(56) References Cited

OTHER PUBLICATIONS

Kato: "Wireless IC Device and Electromagnetic Coupling Module"; U.S. Appl. No. 14/160,597, filed Jan. 22, 2014.
Kato et al.: "Wireless IC Device"; U.S. Appl. No. 14/162,806, filed Jan. 24, 2014.
Kato et al.: "Antenna Device and Wireless Communication Device"; U.S. Appl. No. 14/171,004, filed Feb. 3, 2014.
Kato et al.: "Antenna and Wireless IC Device"; U.S. Appl. No. 14/182,339, filed Feb. 18, 2014.
Kimura et al., "Wireless Communication Device", U.S. Appl. No. 14/187,364, filed Feb. 24, 2014.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
English translation of NL9100176, published on Mar. 2, 1992.
English translation of NL9100347, published on Mar. 2, 1992.
Kato et al.: "ANTENNA"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2011/068110, mailed on Sep. 20, 2011.
Dokai et al.: "Antenna and Wireless Communication Device"; U.S. Appl. No. 13/613,021, filed Sep. 13, 2012.
Takeoka et al.: "Printed Wiring Board and Wireless Communication System"; U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.
Official Communication issued in International Patent Application No. PCT/JP2011/067127, mailed on Oct. 18, 2011.
Kato et al.: "Wireless Communication Device and Metal Article"; U.S. Appl. No. 13/691,996, filed Dec. 3, 2012.
Yosui: "Antenna Apparatus and Communication Terminal Instrument"; U.S. Appl. No. 13/706,409, filed Dec. 6, 2012.
Official Communication issued in International Patent Application No. PCT/JP2011/071795, mailed on Dec. 27, 2011.
Dokai et al.: "Wireless IC Device"; U.S. Appl. No. 13/738,143, filed Jan. 10, 2013.
Official Communication issued in International Patent Application No. PCT/JP2011/074009, mailed on Dec. 20, 2011.
Kato et al.: "Electromagnetic-Coupling-Module-Attached Article"; U.S. Appl. No. 13/754,972, filed Jan. 31, 2013.
Kimura et al.: "Electrical Product"; U.S. Appl. No. 13/757,991, filed Feb. 4, 2013.
Nakano et al.: "Communication Terminal Device"; U.S. Appl. No. 13/760,196, filed Feb. 6, 2013.
Official Communication issued in International Patent Application No. PCT/JP2011/073054, mailed on Dec. 20, 2011.

(56) References Cited

OTHER PUBLICATIONS

Official Communication issued in International Patent Application No. PCT/JP2011/073490, mailed on Jan. 10, 2012.
Kato et al.: "Antenna Device and Communication Terminal Apparatus"; U.S. Appl. No. 13/761,195, filed Feb. 7, 2013.
Kato et al.: "Antenna Device and Mobile Communication Terminal"; U.S. Appl. No. 13/767,960, filed Feb. 15, 2013.
Official Communication issued in International Patent Application No. PCT/JP2012/058884, mailed on Jun. 12, 2012.
Dokai et al.: "Wireless Communication Device"; U.S. Appl. No. 13/782,346, filed Mar. 1, 2013.
Official Communication issued in International Patent Application No. PCT/JP2012/053344, mailed on May 22, 2012.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052594, mailed on May 17, 2011.
Kato et al.: "Wireless IC Device"; U.S. Appl. No. 13/585,866, filed Aug. 15, 2012.
Kato et al.: "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, mailed on Oct. 4, 2011.
Official Communication issued in corresponding Japanese Patent Application No. 2011-552116, mailed on Apr. 17, 2012.
Tsubaki et al.: "RFID Module and RFID Device"; U.S. Appl. No. 13/603,627, filed Sep. 5, 2012.
Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, mailed on May 17, 2011.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material with Electromagnetic Coupling Module,"; U.S. Appl. No. 12/536,663, filed Aug. 6, 2009.
Osamura et al.: "Packaging Material with Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2012/050557, mailed on Apr. 10, 2012.
Kimura et al.: "Wireless Communication Device"; U.S. Appl. No. 13/789,761, filed Mar. 8, 2013.
Dokai et al.: "RFID Chip Package and RFID Tag"; U.S. Appl. No. 13/792,650, filed Mar. 11, 2013.
Kato et al.: "Wireless IC Device Component and Wireless IC Device"; U.S. Appl. No. 13/794,929, filed Mar. 12, 2013.
Kato et al.: "Wireless IC Device and Component for Wireless IC Device"; U.S. Appl. No. 13/848,748, filed Mar. 22, 2013.
Official Communication issued in International Patent Application No. PCT/JP2012/080493, mailed on Dec. 25, 2012.
Mukai et al.: "Inspection Method and Inspection Device for RFID Tag"; U.S. Appl. No. 13/933,184, filed Jul. 2, 2013.
Kato et al.: "Antenna Device and Method of Setting Resonant Frequency of Antenna Device"; U.S. Appl. No. 13/941,760, filed Jul. 15, 2013.
Kato et al.: "Antenna Device and Method of Setting Resonant Frequency of Antenna Device"; U.S. Appl. No. 13/943,973, filed Jul. 17, 2013.
Official Communication issued in International Patent Application No. PCT/JP2012/080700, mailed on Jan. 15, 2013.

(56) References Cited

OTHER PUBLICATIONS

Mukai et al.: "Wireless Integrated Circuit Device and Method of Manufacturing the Same"; U.S. Appl. No. 13/961,995, filed Aug. 8, 2013.
Kato et al: "Radio IC Device"; U.S. Appl. No. 13/964,234, filed Aug. 12, 2013.
Official Communication issued in International Patent Application No. PCT/JP2012/067779, mailed on Aug. 28, 2012.
Official Communication issued in International Patent Application No. PCT/JP2013/051254, mailed on Apr. 2, 2013.
Dokai: "Wireless Communication Device"; U.S. Appl. No. 13/970,633, filed Aug. 20, 2013.
Official Communication issued in International Patent Application No. PCT/JP2012/059350, mailed on Jul. 3, 2012.
Dokai: "Wireless IC Device"; U.S. Appl. No. 14/011,823, filed Aug. 28, 2013.
Official Communication issued in International Patent Application No. PCT/JP2012/055505, mailed on Jun. 5, 2012.
Kato: "Radio IC Device and Radio Communication Terminal"; U.S. Appl. No. 14/017,406, filed Sep. 4, 2013.
Official Communication issued in International Patent Application No. PCT/JP2012/067454, mailed on Aug. 7, 2012.
Kato: "Antenna Device and Communication Terminal Apparatus"; U.S. Appl. No. 14/019,573, filed Sep. 6, 2013.
Official Communication issued in International Patent Application No. PCT/JP2012/067537, mailed on Oct. 9, 2012.
Kato: "Radio Communication Device"; U.S. Appl. No. 14/027,384, filed Sep. 16, 2013.
Kato: "Antenna Device, RFID Tag, and Communication Terminal Apparatus"; U.S. Appl. No. 14/031,270, filed Sep. 19, 2013.
Kato et al.: "Wireless IC Device"; U.S. Appl. No. 14/054,865, filed Oct. 16, 2013.
Official Communication issued in International Patent Application No. PCT/JP2012/062259, mailed on Jun. 12, 2012.
Dokai et al.: "Radio IC Device"; U.S. Appl. No. 14/078,596, filed Nov. 13, 2013.

\* cited by examiner

ANTENNA DEVICE AND WIRELESS COMMUNICATION DEVICE

BACKGROUND OF THE INVENTION

1. Field of the Invention

The present invention relates to an antenna device and a wireless communication device preferably for use in an RFID system that includes a contactless IC card or an RF tag and the like.

2. Description of the Related Art

An RFID system in which a reader-writer and an RFID tag wirelessly communicate with each other in such a manner that information is transmitted between the reader-writer and the RFID tag has been widely used as an item management system. A reader-writer and an RFID tag are each formed of an RFID IC chip for processing a radio signal and an antenna for transmitting and receiving a radio signal, and a predetermined communication is performed between an antenna of a reader-writer and an antenna of an RFID tag via a magnetic field or an electromagnetic field.

In recent years, an RFID system has been introduced in a wireless communication terminal as in, for example, Felica (Registered Trademark), and such a wireless communication terminal may sometimes be used as a reader-writer or an RFID tag. In particular, two antennas, such as a transmission antenna and a reception antenna or an antenna for a tag and an antenna for a reader-writer, capable of being compatible with systems using the same frequency band may sometimes be provided in a wireless communication terminal.

In the case where two antennas capable of being compatible with systems using the same frequency band are provided in one terminal, it is necessary to suppress mutual interference between the antennas. For example, Japanese Unexamined Patent Application Publication No. 2004-213582 and Japanese Unexamined Patent Application Publication No. 2006-126901 disclose configurations in which a conductive member or a soft magnetic member is disposed between two antennas.

On the other hand, for example, in a contactless automatic ticket gate system, during the period when a user is holding an IC card over a reader-writer that is disposed in a main body of a ticket gate, transmission and reception of data is performed between the reader-writer and the IC card. In this case, an antenna of the IC card is held over an antenna of the reader-writer at any of various angles, and reading and writing of the IC card may sometimes not be performed depending on the angle.

Therefore, as disclosed in Japanese Unexamined Patent Application Publication No. 4-134910, Japanese Unexamined Patent Application Publication No. 8-044833, and Japanese Unexamined Patent Application Publication No. 2002-043827, and the like, there is known a reader-writer in which two coil antennas (loop antennas) are disposed in such a manner that the angle formed by coil surfaces (loop surfaces) of the coil antennas is 90 degrees.

According to the antenna devices disclosed in Japanese Unexamined Patent Application Publication No. 2004-213582 and Japanese Unexamined Patent Application Publication No. 2006-126901, although mutual interference between antennas that are adjacent to each other can be suppressed, loss (eddy-current loss) due to a conductive member and a soft magnetic member is likely to be large, and thus, it is difficult to secure a large communication range. In addition, since the configuration of a tag becomes complicated, and also the size of the tag becomes large, manufacturing tolerance is large, and the manufacturing costs are likely to be high.

In the case where one of the antenna devices disclosed in Japanese Unexamined Patent Application Publication No. 4-134910, Japanese Unexamined Patent Application Publication No. 8-044833, and Japanese Unexamined Patent Application Publication No. 2002-043827 is provided in a reader-writer, two coil antennas need to be disposed in such a manner that the angle formed by coil surfaces of the coil antennas is 90 degrees, and thus, the configuration of the antenna device becomes complicated. In addition, the size of the antenna device becomes large, and thus, the installation location and utilization of the antenna device will be limited.

SUMMARY OF THE INVENTION

Preferred embodiments of the present invention provide an antenna device and a wireless communication device in which a problem of an increase in size of the case containing a plurality of antennas in one device or apparatus is solved.

An antenna device according to a preferred embodiment of the present invention includes a first coil antenna and a second coil antenna that is disposed in the vicinity of the first coil antenna. The first coil antenna includes one coil conductor. The second coil antenna includes two coil conductors, and the two coil conductors are disposed and wound such that a magnetic field that is generated by the two coil conductors defines a closed magnetic circuit. A winding axis of the coil conductor of the first coil antenna is oriented in a direction that is the same or substantially the same as a direction in which winding axes of the two coil conductors of the second coil antenna are oriented. The closed magnetic circuit circulates in or substantially in an area inside the coil conductor of the first coil antenna or circulates in or substantially in an area outside the coil conductor of the first coil antenna via the coil conductor of the first coil antenna.

According to this configuration, the degree of coupling of the first coil antenna and the second coil antenna is very small, and mutual interference between the first coil antenna and the second coil antenna are suppressed. In addition, since a conductive member and a soft magnetic member are not necessary, a reduction in size is achieved, and since the first coil antenna and the second coil antenna are not covered with a conductive member or a soft magnetic member in this configuration, an antenna device having a low loss and a long communication range is realized.

For example, the first coil antenna is an antenna that is used in a first communication system, and the second coil antenna is an antenna that is used in a second communication system. With this configuration, the antenna device can be used in at least two communication systems even though the antenna device is a single antenna device.

Typically, the first communication system and the second communication system are communication systems that use the same frequency band. Therefore, two antennas each having a different directivity can be used in communication systems that use the same frequency band.

It is preferable that the first coil antenna and the second coil antenna be arranged such that the winding axis of the coil conductor of the first coil antenna is present in a plane that includes the winding axes of the two coil conductors of the second coil antenna.

With this configuration, the first coil antenna and the second coil antenna will further not be coupled to each other, and the independence is improved.

It is preferable that a region in which the first coil antenna is located and a region in which the second coil antenna is located be at least partially superposed with each other when seen in plan view from the winding axis directions of the winding axes of the two coil conductors of the second coil antenna and the winding axis of the coil conductor of the first coil antenna.

According to this configuration, the regions in which the first coil antenna and the second coil antenna are located are reduced in size as compared with the case where the first coil antenna and the second coil antenna are individually provided, and thus, a small-sized antenna device is provided.

In the above-described preferred embodiment of the present invention, for example, the first coil antenna and the second coil antenna preferably are positioned adjacent to each other such that a coil surface of each of the first and second coil antennas are positioned on the same or substantially the same plane, and the first coil antenna and the second coil antenna are used in one communication system.

According to this configuration, a magnetic flux that is generated by the first coil antenna or a magnetic flux that links with the first coil antenna and a magnetic flux that is generated by the second coil antenna or a magnetic flux that links with the second coil antenna are substantially perpendicular to each other. In addition, although the first coil antenna and the second coil antenna are adjacent to each other, the first coil antenna and the second coil antenna will not interfere with each other. Therefore, a communication with an antenna device, which is a communication partner, via an electromagnetic field can be performed with a very wide angular relationship.

It is preferable that regions in which the two coil conductors of the second coil antenna have a positional relationship in which the coil conductor of the first coil antenna is interposed between the regions within or substantially within a plane.

According to this configuration, the regions in which the two coil conductors of the second coil antenna are located are reduced in size as compared with the case where the first coil antenna and the second coil antenna are individually provided, and thus, a small-sized antenna device is provided.

In any one of the above-described preferred embodiments of the present invention, it is preferable that the antenna device include, as may be necessary, a power supply coil that is configured to be in an electromagnetic field coupling relationship with at least one of the first coil antenna and the second coil antenna.

According to this configuration, although a small-sized power supply coil is preferably used, an antenna device with high radiation efficiency can be obtained. In addition, a power supply coil, the first coil antenna, and the second coil antenna can be disposed at appropriate positions, and this facilitates assembling. Furthermore, a power supply circuit can be protected against a surge caused by static electricity or thunder.

A wireless communication device according to a preferred embodiment of the present invention includes an antenna device that includes a first coil antenna and a second coil antenna disposed in the vicinity of the first coil antenna. The first coil antenna includes one coil conductor. The second coil antenna includes two coil conductors, and the two coil conductors are disposed and wound such that a magnetic field that is generated by the two coil conductors defines a closed magnetic circuit. A winding axis of the coil conductor of the first coil antenna is oriented in a direction that is the same or substantially the same as a direction in which winding axes of the two coil conductors of the second coil antenna are oriented. The closed magnetic circuit circulates in or substantially in an area inside the coil conductor of the first coil antenna or circulates in or substantially in an area outside the coil conductor of the first coil antenna via the coil conductor of the first coil antenna.

It is preferable that the antenna device be compatible with a first communication system and a second communication system, and that the first coil antenna and the second coil antenna be allocated depending on a length of the longest communication range required for the first communication system and the second communication system.

According to this configuration, the antenna device can be applied to, for example, both a proximity-type communication system having a maximum communication range of about 10 cm and a vicinity-type communication system having a maximum communication range of about 70 cm, for example.

In the above-described preferred embodiments of the communication device, for example, the first coil antenna and the second coil antenna preferably are positioned adjacent to each other such that coil surfaces of the first and second coil antennas are positioned on the same or substantially the same plane, and the first coil antenna and the second coil antenna are used in one communication system.

According to this configuration, a small-sized wireless communication device capable of communicating with an antenna device, which is a communication partner, via an electromagnetic field with a very wide angular relationship is provided.

The wireless communication device may include a common power supply circuit that supplies power to the first coil antenna and the second coil antenna and a switch that selectively performs switching of a signal path between the first coil antenna and the second coil antenna and the power supply circuit.

According to this configuration, the antenna directivity of the first coil antenna and the antenna directivity of the second coil antenna can be selectively switched as may be necessary.

It is preferable that the wireless communication device include, as may be necessary, a power supply coil that is configured to be in an electromagnetic field coupling relationship with at least one of the first coil antenna and the second coil antenna.

According to this configuration, although a small-sized power supply coil is preferably used, an antenna device with high radiation efficiency is obtained. In addition, a power supply coil, the first coil antenna, and the second coil antenna can be disposed at appropriate positions, and this facilitates assembling. Furthermore, a power supply circuit can be protected against a surge caused by static electricity or thunder.

According to various preferred embodiments of the present invention, a first coil antenna substantially does not pick up an induction field of a second coil antenna, and also the second coil antenna substantially does not pick up an induction field of the first coil antenna. In other words, the degree of coupling of the first coil antenna and the second coil antenna is very small. As a result, although the first coil antenna and the second coil antenna are adjacent to each other, mutual interference between the coil antennas is reliably suppressed. In addition, since a conductive member and a soft magnetic member are not necessary, a reduction in size is achieved, and since the first coil antenna and the second coil antenna are not covered with a conductive member or a soft magnetic member in the configuration of various preferred embodiments of the present invention, an antenna device and a wireless communication device having a low loss and a long communication range are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A and 5B are diagrams illustrating a configuration of a wireless communication device 201 such as a cellular phone terminal that includes the antenna device 101 wherein FIG. 5A is a plan view of a lower casing (a diagram illustrating an inner bottom surface), and FIG. 5B is a sectional view of the wireless communication device 201.

DETAILED DESCRIPTION OF THE PREFERRED EMBODIMENTS

First Preferred Embodiment

An antenna device 101 according to a first preferred embodiment will be described with sequential reference to the drawings.

Figure 1A:
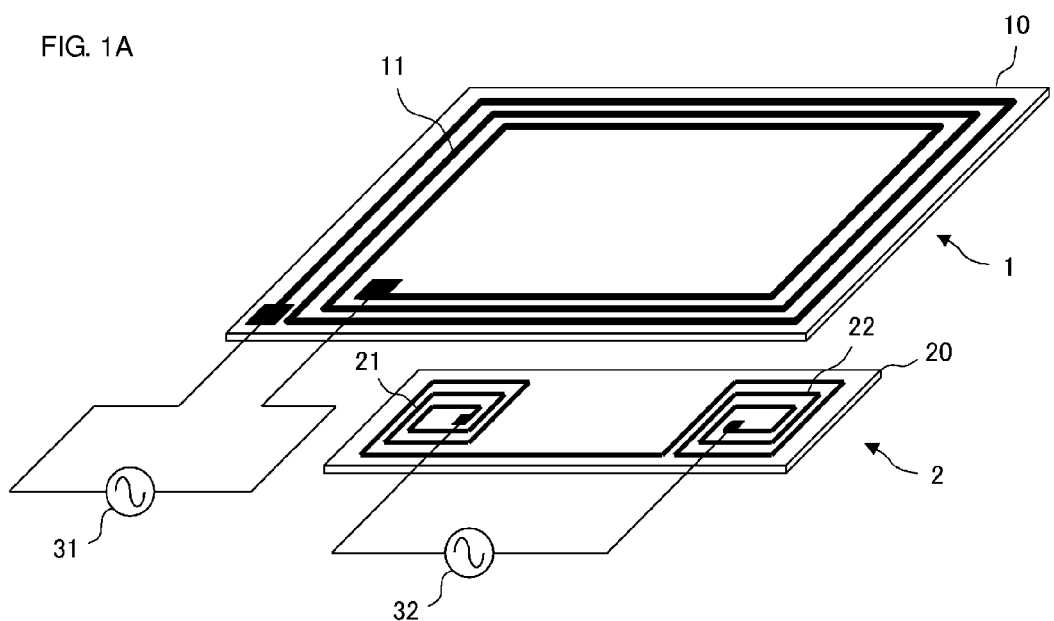
FIG. 1A is an exploded perspective view of an antenna device 101 according to a first preferred embodiment of the present invention.
Figure 1B:
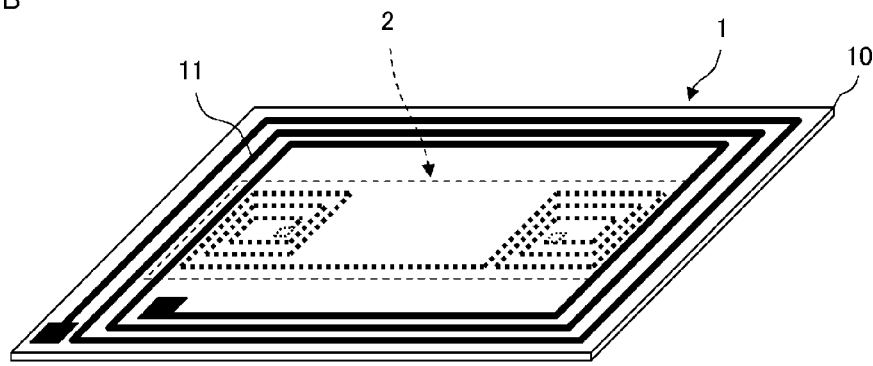
FIG. 1B is an external perspective view of the antenna device 101.

FIG. 1A is an exploded perspective view of the antenna device 101, and FIG. 1B is an external perspective view of the antenna device 101. This antenna device 101 includes a first coil antenna 1 and a second coil antenna 2. The first coil antenna 1 preferably is one in which a coil conductor 11 having a rectangular or substantially rectangular spiral shape is provided on a non-magnetic insulating base member 10. The second coil antenna 2 is one in which two coil conductors 21 and 22 are provided on a non-magnetic insulating base member 20. A first power supply circuit 31 is connected to the coil conductor 11 of the first coil antenna 1, and a second power supply circuit 32 is connected to the coil conductors 21 and 22 of the second coil antenna 2.

These two coil conductors 21 and 22 are disposed and wound such that a closed magnetic circuit (described later) that is defined by a magnetic field generated by applying a current to the coil conductors 21 and 22 circulates in a coil opening of the coil conductor 11 of the first coil antenna 1.

Figure 2A:
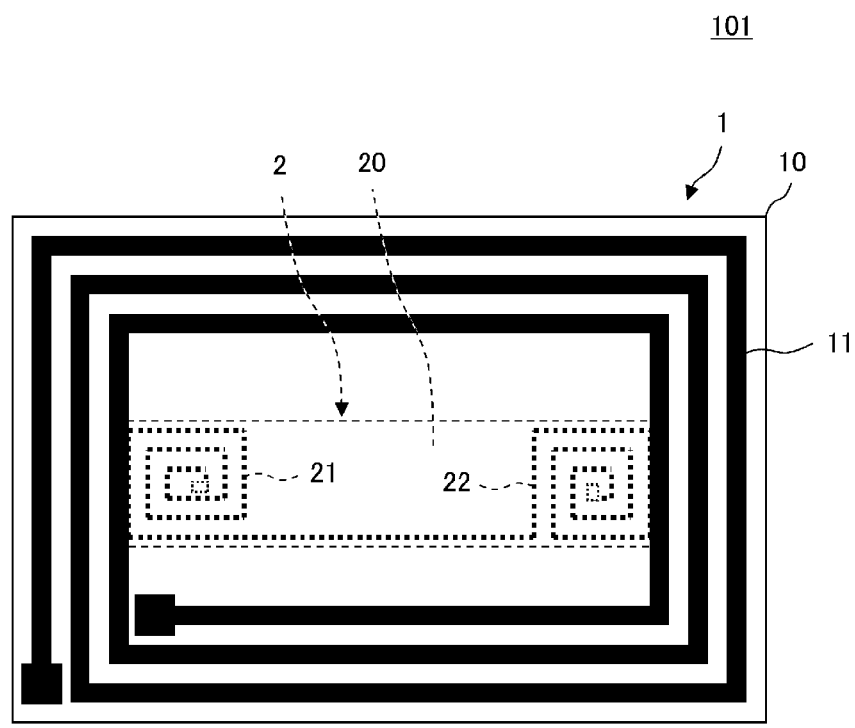
FIG. 2A is a plan view of the antenna device 101.
Figure 2B:
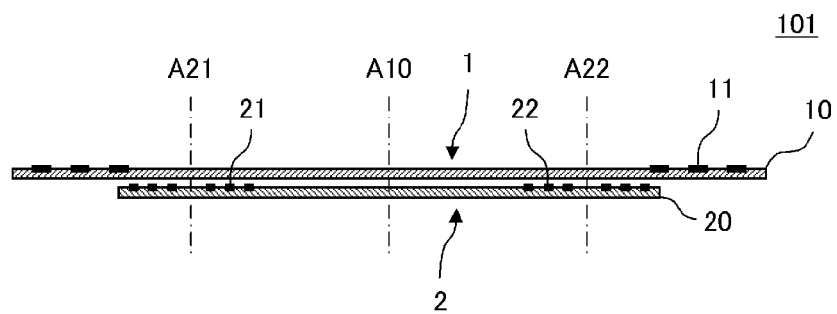
FIG. 2B is a front view of the antenna device 101.

FIG. 2A is a plan view of the antenna device 101, and FIG. 2B is a front view of the antenna device 101.

Winding axes A21 and A22 of the two coil conductors 21 and 22 of the second coil antenna 2 and a winding axis A10 of the first coil antenna 1 are parallel or substantially parallel to one another. In other words, the winding axis directions match one another. When seen in plan view from these winding axis directions, a region in which the first coil antenna 1 is located and a region in which the second coil antenna 2 is located are superposed with each other.

Figure 3:
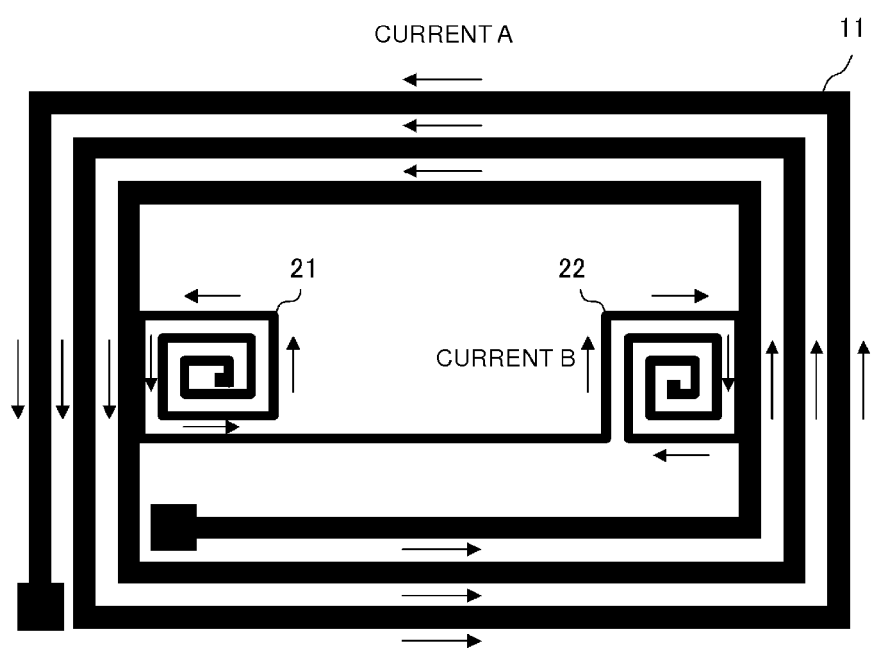
FIG. 3 is a diagram illustrating directions of currents that flow through a coil conductor 11 of a first coil antenna 1 and coil conductors 21 and 22 of a second coil antenna 2.
Figure 4:
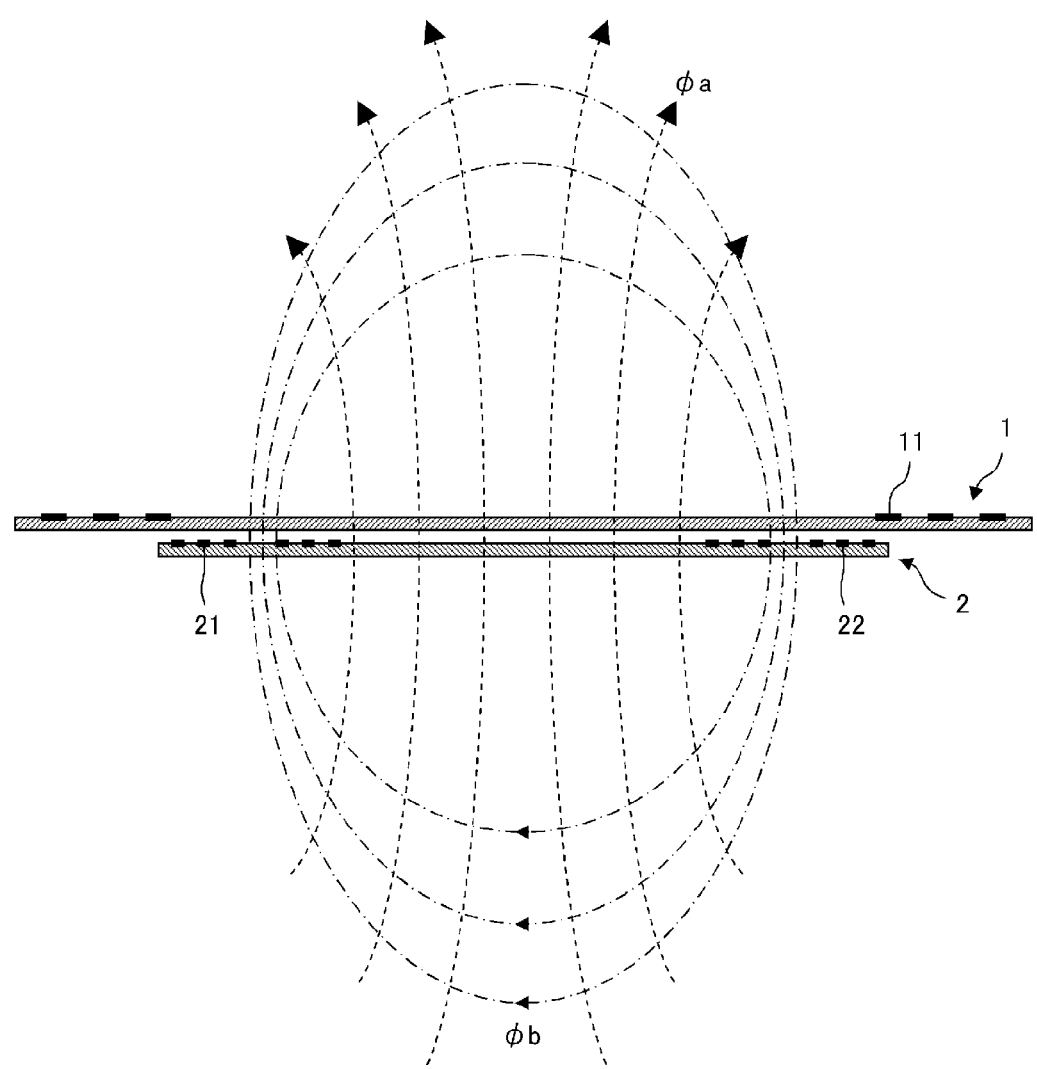
FIG. 4 is a diagram representing, with lines of magnetic force, magnetic fields that are induced by the coil conductors 11, 21, and 22.

FIG. 3 is a diagram illustrating directions of currents that flow through the coil conductor 11 of the first coil antenna 1 and the coil conductors 21 and 22 of the second coil antenna 2. In FIG. 3, the base member is illustrated as being transparent. FIG. 4 is a diagram representing, with lines of magnetic force, magnetic fields that are induced by the coil conductors 11, 21, and 22 in the case illustrated in FIG. 3.

As illustrated in FIG. 3, when a current A flows through the coil conductor 11 of the first coil antenna 1, a magnetic field such as that represented by a magnetic flux $\phi a$ in FIG. 4 is generated. As illustrated in FIG. 3, when a current B flows through the coil conductors 21 and 22 of the second coil antenna 2, a magnetic field such as that represented by a magnetic flux $\phi b$ in FIG. 4 is generated.

As illustrated in FIG. 3, the winding directions of the coil conductors 21 and 22 of the second coil antenna 2 are the same as each other, and outer terminals of the coil conductors 21 and 22 are connected to each other. Thus, a magnetic flux that is induced by applying a current to the coil conductors 21 and 22 forms loops so as to define a closed magnetic circuit. The first coil antenna and the second coil antenna are disposed such that the winding axis of the coil conductor of the first coil antenna is present in a plane that includes the winding axes of the two coil conductors of the second coil antenna. In other words, the first coil antenna and the second coil antenna are arranged such that the closed magnetic circuit of the second coil antenna circulates in one plane that is perpendicular or substantially perpendicular to a coil opening surface of the first coil antenna. A magnetic field that is induced by applying a current to the coil conductor 11 of the first coil antenna 1 is oriented in a direction perpendicular or substantially perpendicular to the coil opening surface of the coil conductor 11.

As described above, the first coil antenna 1 and the second coil antenna 2 are arranged such that the winding axis of the coil conductor of the first coil antenna is present in the plane, which includes the winding axes of the two coil conductors of the second coil antenna. Therefore, the magnetic flux $\phi a$ and the magnetic flux $\phi b$ are perpendicular or substantially perpendicular to each other, and the first coil antenna 1 and the second coil antenna 2 are not coupled to each other. Since the directions of the coil winding axes of the coil conductors 11, 21, and 22 match one another, the coil conductor 11 is coupled to the coil conductor 21, and the coil conductor 11 is also coupled to the coil conductor 22. However, the polarities of these two couplings are opposite to each other, and thus, the two couplings cancel each other out.

On the other hand, for example, unlike the present preferred embodiment, in the case where the coil conductor 21 is disposed in an area outside a region in which the coil conductor 11 is located, and the coil conductor 22 is disposed in the coil opening of the coil conductor 11 (an area inside the region in which the coil conductor 11 is located), the closed magnetic circuit of the second coil antenna 2 will be coupled to the first coil antenna 1, and thus, this is not preferable.

Figure 5A:
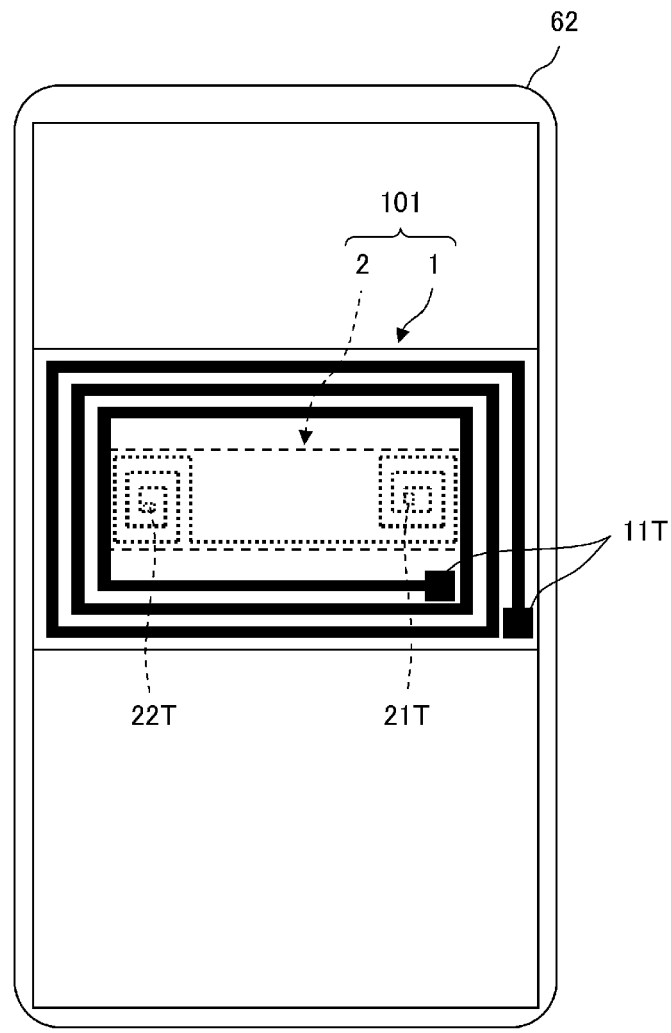
Figure 5B:
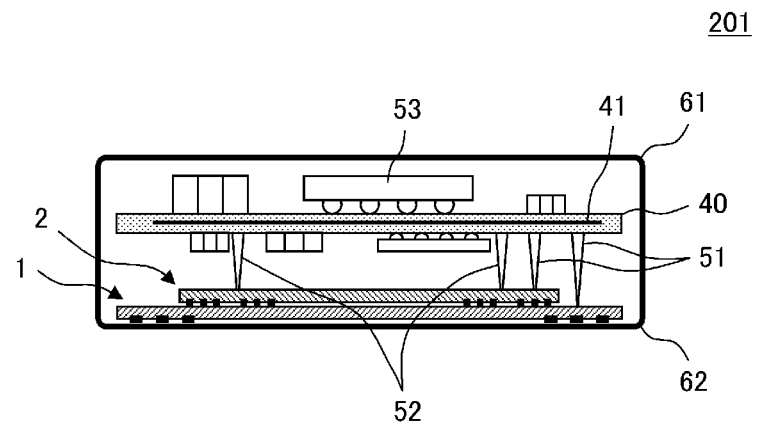

FIGS. 5A and 5B are diagrams illustrating a configuration of a wireless communication device 201 such as a cellular phone terminal that includes the antenna device 101. FIG. 5A is a plan view of a lower casing (a diagram illustrating an inner bottom surface), and FIG. 5B is a sectional view of the wireless communication device 201.

The second coil antenna 2 is attached to the first coil antenna 1 preferably via a double-sided adhesive sheet or the like. The first coil antenna 1 is attached to the inner bottom surface of a lower casing 62. The lower casing 62 preferably is a formed product made of an insulating resin. A printed wiring board 40 on which an electronic component such as an RFIC chip 53 is mounted is accommodated in an internal space defined by the lower casing 62 and an upper casing 61. A liquid crystal display panel and the like are provided on the side of the upper casing 61. A ground conductor 41 is located in or on the printed wiring board 40. A power supply circuit to the first coil antenna 1 and a power supply circuit to the second coil antenna 2 are located in or on the printed wiring board 40. Contact pins 51 that are in contact with terminals 11T of the first coil antenna 1 and contact pins 52 that are in contact with terminals 21T and 22T of the second coil antenna 2 are provided in or on the printed wiring board 40.

A first power supply circuit that supplies power to the first coil antenna 1 and a second power supply circuit that supplies power to the second coil antenna 2 are used in communication systems that use the same frequency band, for example, a frequency band of 13.56 MHz or the like. The first coil antenna 1 and the second coil antenna 2 are allocated depending on the length of the longest communication range required for a communication system. As illustrated in FIG. 4, a magnetic field generated by the first coil antenna 1 (loops of lines of magnetic force) has characteristics to extend over a wide area, and thus, the magnetic field generated by the first coil antenna 1 is used in, for example, a vicinity-type communication system having a maximum communication range of about 70 cm. A magnetic field generated by the second coil antenna 2 (loops of lines of magnetic force) has characteristics so as not to extend over a wide area, and thus, the magnetic field generated by the second coil antenna 2 is used in, for example, a proximity-type communication system having a maximum communication range of about 10 cm.

As described above, a wireless communication device such as a cellular phone terminal in which the antenna device 101 is disposed on an inner surface of a casing is located.

Second Preferred Embodiment

Figure 6A:
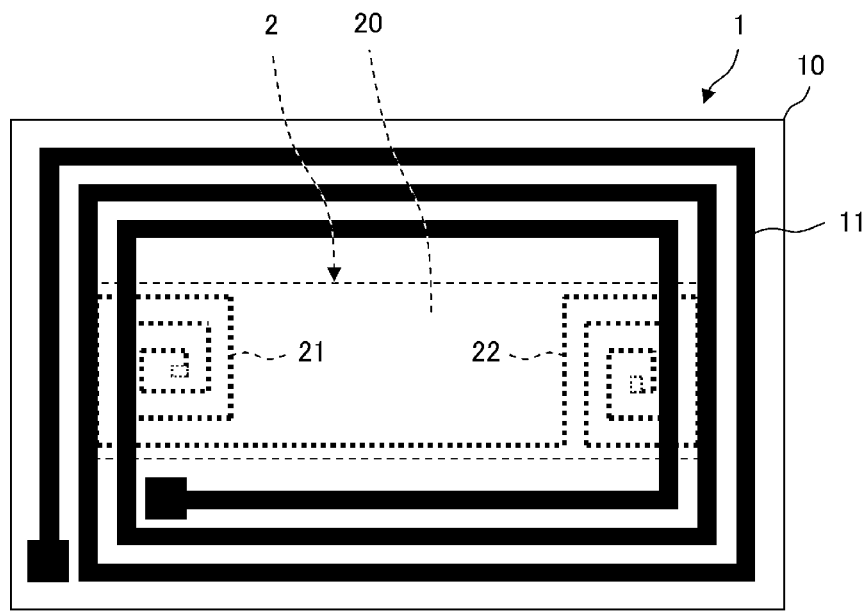
FIG. 6A is a plan view of an antenna device 102A of a second preferred embodiment of the present invention.
Figure 6B:
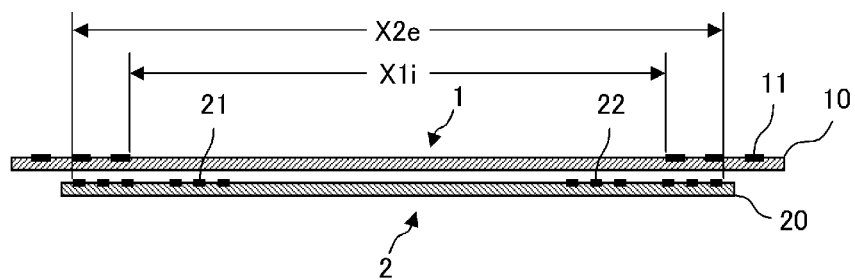
FIG. 6B is a front view of the antenna device 102A.
Figure 7A:
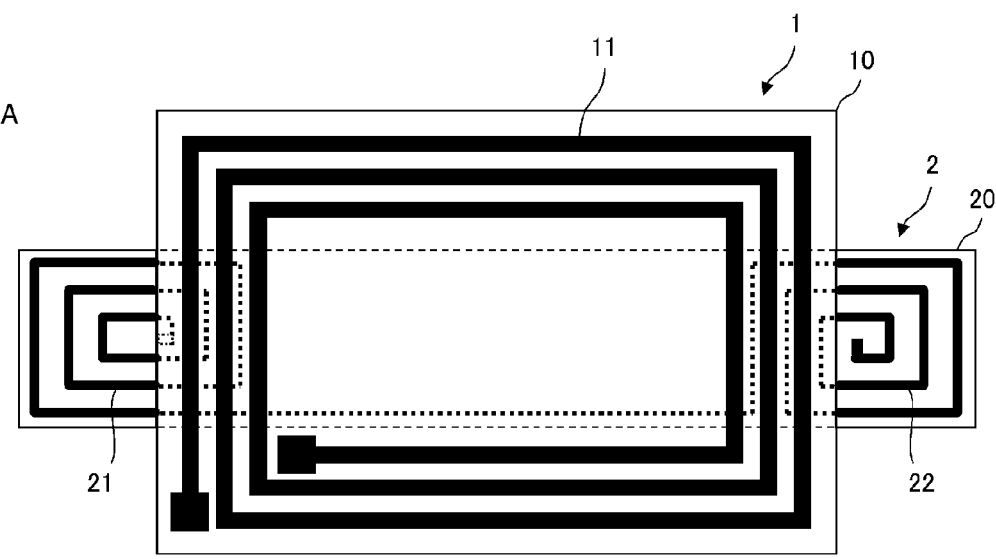
FIG. 7A is a plan view of another antenna device 102B of the second preferred embodiment of the present invention.
Figure 7B:
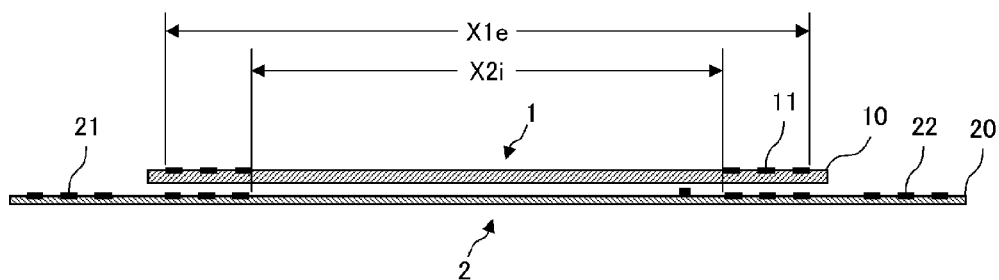
FIG. 7B is a front view of the antenna device 102B.
Figure 8:
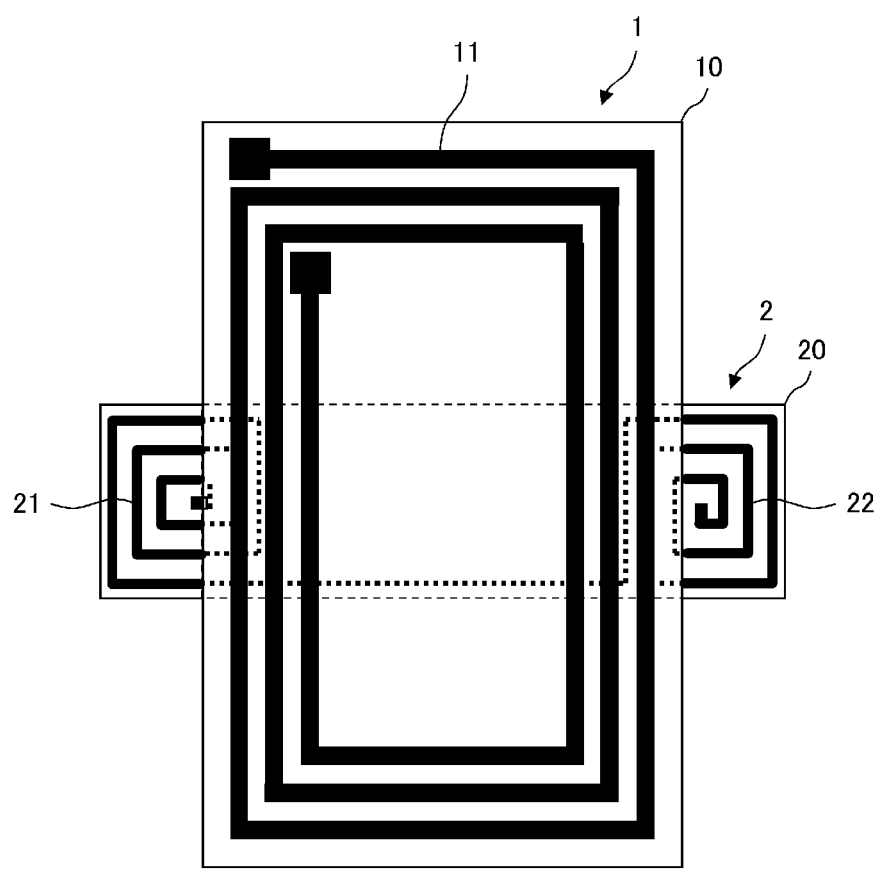
FIG. 8 is a plan view of another antenna device 102C of the second preferred embodiment of the present invention.

FIG. 6A is a plan view of an antenna device 102A of a second preferred embodiment of the present invention, and FIG. 6B is a front view of the antenna device 102A. FIG. 7A is a plan view of another antenna device 102B of the second preferred embodiment, and FIG. 7B is a front view of the antenna device 102B. FIG. 8 is a plan view of another antenna device 102C of the second preferred embodiment.

A difference from the antenna device 101 of the first preferred embodiment illustrated in FIG. 2 is the positional relationship between a first coil antenna 1 and a second coil antenna 2. In each of the antenna devices 102A, 102B, and 102C, the winding axis directions of winding axes of two coil conductors 21 and 22 of the second coil antenna 2 and the winding axis direction of a winding axis of the first coil antenna 1 match or substantially match one another (the winding axes are parallel or substantially parallel to one another). When seen in plan view from these winding axis directions, a region in which the first coil antenna 1 is located and a region in which the second coil antenna 2 is located are superposed with each other. In the antenna device 102A illustrated in FIG. 6, the dimensions X2*e* between ends of regions in which the two coil conductors 21 and 22 of the second coil antenna 2 are located that oppose each other and that are located farthest from each other are larger than the inside dimensions X1*i* of a coil opening of a coil conductor 11. In the antenna device 102B illustrated in FIG. 7, the dimensions X2*i* between inner ends of the regions in which the two coil conductors 21 and 22 of the second coil antenna 2 are located that are closest to each other are smaller than the outside dimensions X1*e* of the coil opening of the coil conductor 11. FIG. 8 also has this relationship. In other words, in each of FIGS. 6, 7, and 8, when seen in plan view, the coil conductors 21 and 22 are partially superposed with the coil conductor 11. In the antenna device 102A illustrated in FIG. 6, the closed magnetic circuit defined by the coil conductors 21 and 22 of the second coil antenna 2 circulates in or substantially in an area inside the first coil antenna 1 (the coil conductor 11), and in the antenna devices 102B and 102C illustrated in FIG. 7 and FIG. 8, the closed magnetic circuit defined by the coil conductors 21 and 22 of the second coil antenna 2 circulates in or substantially in an area outside the first coil antenna 1 (the coil conductor 11) via the coil conductor 11 of the first coil antenna 1, that is, in such a manner that loops of a magnetic field of the closed magnetic circuit are partially superposed with the coil conductor when seen in plan view.

The longitudinal direction of the first coil antenna 1 and the longitudinal direction of the second coil antenna 2 are not necessarily the same direction (a parallel or substantially parallel direction) as illustrated in FIG. 2, FIG. 6, and FIG. 7 and may be perpendicular or substantially perpendicular to each other as illustrated in FIG. 8.

As described above, when seen in plan view, although the coil conductors 21 and 22 and the coil conductor 11 are partially superposed with one another, the closed magnetic circuit defined by the coil conductors 21 and 22 of the second coil antenna 2 is perpendicular or substantially perpendicular to the coil axis of the coil conductor 11 of the first coil antenna 1. In addition, the closed magnetic circuit defined by the coil conductors 21 and 22 of the second coil antenna 2 circulates in or substantially in an area inside or an area outside the first coil antenna 1 (the coil conductor 11). Therefore, the magnetic field generated by the first coil antenna 1 and the magnetic field generated by the second coil antenna 2 are perpendicular or substantially perpendicular to each other, and the first coil antenna 1 and the second coil antenna 2 are not coupled to each other. Since the directions of the coil winding axes of the coil conductors 11, 21, and 22 match one another, the coil conductor 11 is coupled to the coil conductor 21, and the coil conductor 11 is also coupled to the coil conductor 22. However, the polarities of these two couplings are opposite to each other, and thus, the two couplings cancel each other out.

Third Preferred Embodiment

Figure 9A:
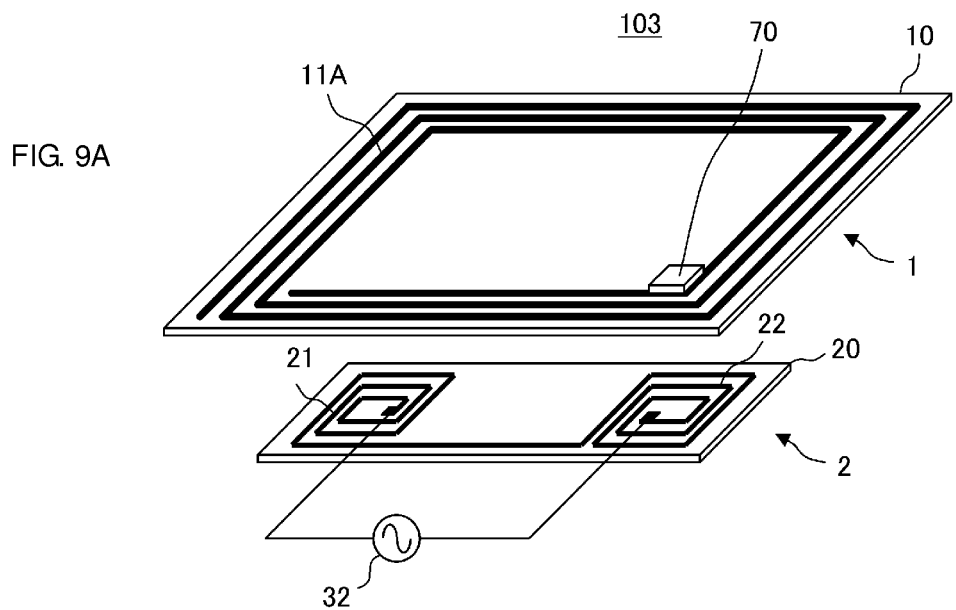
FIG. 9A is an exploded perspective view of an antenna device 103 of a third preferred embodiment of the present invention.
Figure 9B:
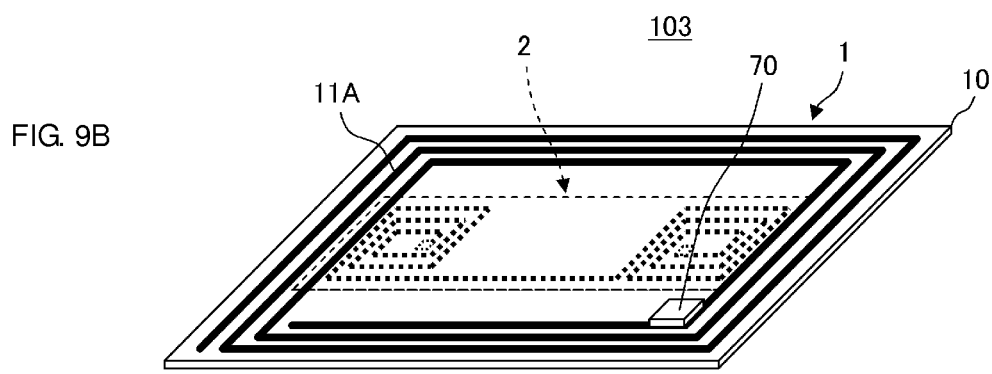
FIG. 9B is an external perspective view of the antenna device 103.
Figure 9C:
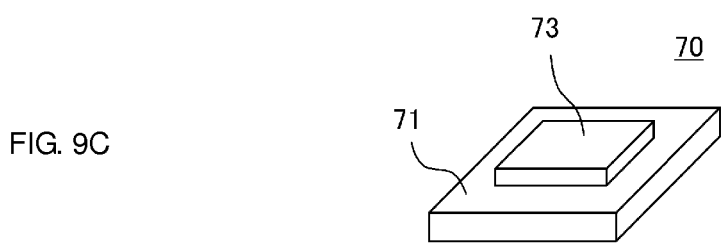
FIG. 9C is a perspective view of an RFIC module 70 that is to be mounted in the antenna device 103.
Figure 9D:
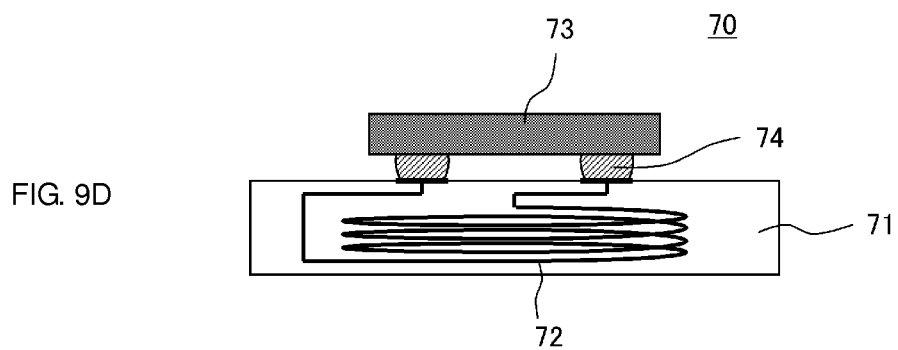
FIG. 9D is a sectional view of the RFIC module 70.
Figure 10A:
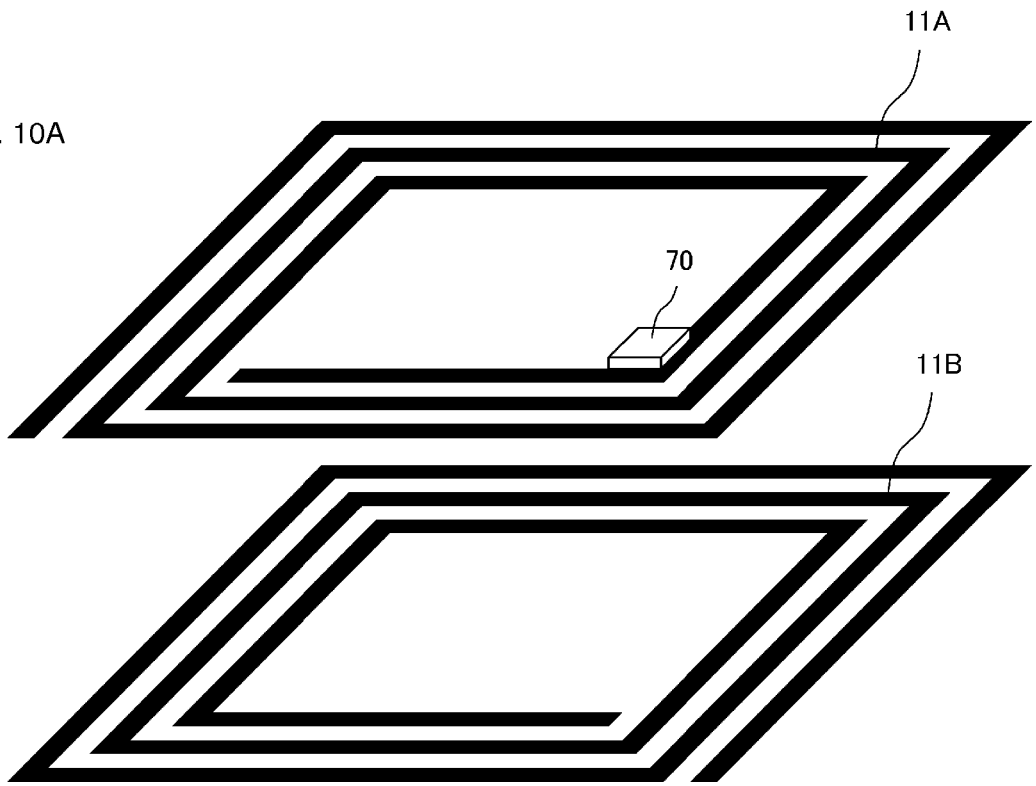
FIG. 10A is an exploded perspective view illustrating only coil conductors of a first coil antenna 1.
Figure 10B:
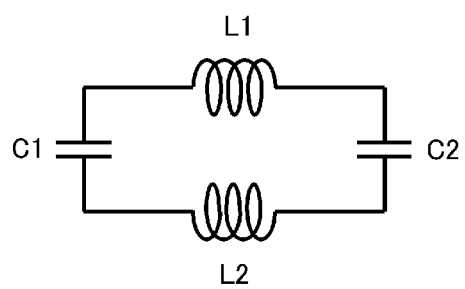
FIG. 10B is an equivalent circuit diagram of the first coil antenna.

FIG. 9A is an exploded perspective view of an antenna device 103 of a third preferred embodiment of the present invention, FIG. 9B is an external perspective view of the antenna device 103, FIG. 9C is a perspective view of an RFIC module 70 that is to be mounted in the antenna device 103, and FIG. 9D is a sectional view of the RFIC module 70. FIG. 10A is an exploded perspective view illustrating only coil conductors of a first coil antenna 1, and FIG. 10B is an equivalent circuit diagram of the first coil antenna.

Regarding the coil conductors of the first coil antenna 1, as illustrated in FIG. 10A, a top surface coil conductor 11A and a bottom surface coil conductor 11B are located on the front and rear sides of a base member 10. The winding direction of the top surface coil conductor 11A and the winding direction of the bottom surface coil conductor 11B are opposite to each other (are the same as each other in the perspective direction), and the top surface coil conductor 11A and the bottom surface coil conductor 11B are arranged to face each other. When an inductance that is generated by the top surface coil conductor 11A is represented by L1, an inductance that is generated by the bottom surface coil conductor 11B is represented by L2, and capacitances between the coil conductors are represented by capacitances C1 and C2, an LC resonance circuit such as that illustrated in FIG. 10B is defined. The resonant frequency of this LC resonance circuit is a carrier frequency of a communication system that communicates by using the first coil antenna or a frequency near the carrier frequency.

The RFIC module 70, which is a power supply circuit, includes a power supply coil substrate 71 in which a power supply coil 72 is provided and an RFIC chip 73. The RFIC chip 73 is mounted on the power supply coil substrate 71 via a conductive bonding material 74 and connected to the power supply coil 72.

As illustrated in FIG. 9A, the RFIC module 70 is disposed in (bonded to) a corner portion of the coil conductor 11 of the first coil antenna 1, so that the power supply coil 72 and the coil conductors 11A and 11B have a magnetic field coupling relationship. The RFIC chip 73 corresponds to a first power supply circuit.

As described above, the power supply circuit and the coil conductors 11A and 11B may have a magnetic field coupling relationship instead of being directly connected to one another. Alternatively, not limited to such a magnetic field coupling, the power supply circuit and end portions of the coil conductors may have an electric field coupling relationship by providing an electrode that opposes the coil conductors of the first coil antenna to the power supply coil substrate 71.

In addition, in the present preferred embodiment, winding axes of coil conductors 21 and 22 of a second coil antenna 2 are both positioned in an opening of the first coil antenna 1. As a result, a closed magnetic circuit of the second coil antenna 2 substantially circulates in the opening of the first coil antenna 1, that is, an area inside the coil conductors 11 of the first coil antenna. The second coil antenna may be configured such that the closed magnetic circuit circulates in the opening of the first coil antenna 1 as described above.

Fourth Preferred Embodiment

Figure 11:
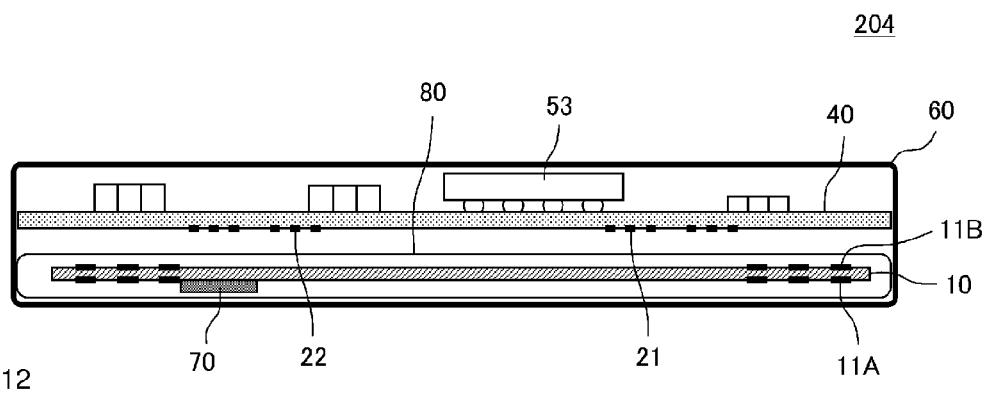
FIG. 11 is a sectional view of a wireless communication device 204 such as a cellular phone terminal according to a fourth preferred embodiment of the present invention.

FIG. 11 is a sectional view of a wireless communication device 204 such as a cellular phone terminal according to a fourth preferred embodiment of the present invention. A card-type device 80 is disposed in a casing 60. This card-type device 80 includes a base member 10, coil conductors 11A and 11B that are provided on both sides of the base member 10, and an RFIC module 70. The basic internal configuration of the card-type device 80 is preferably the same or substantially the same as that of the first coil antenna 1 of the third preferred embodiment illustrated in FIG. 9 and FIG. 10.

A printed wiring board 40 on which an electronic component is mounted is accommodated in the casing 60. Two coil conductors 21 and 22 for a second coil antenna are located on the printed wiring board 40. In addition, an RFIC chip 53 that is a power supply circuit to the second coil antenna is mounted on the printed wiring board 40.

The positional relationship between the coil conductors 21 and 22 of the second coil antenna, which are located on the printed wiring board 40, and the coil conductors 11A and 11B of a first coil antenna is the same as that of the third preferred embodiment illustrated in FIG. 9.

As described above, the card-type device 80 may include the first coil antenna and the RFIC module 70 and may be disposed in a casing of a wireless communication device. Since the card-type device 80 can be electrically isolated from the printed wiring board 40, electrical connection of the card-type device 80 and the printed wiring board 40 in the casing is not necessary. The second coil antenna may be located on the printed wiring board as shown in FIG. 11.

Fifth Preferred Embodiment

Figure 12:
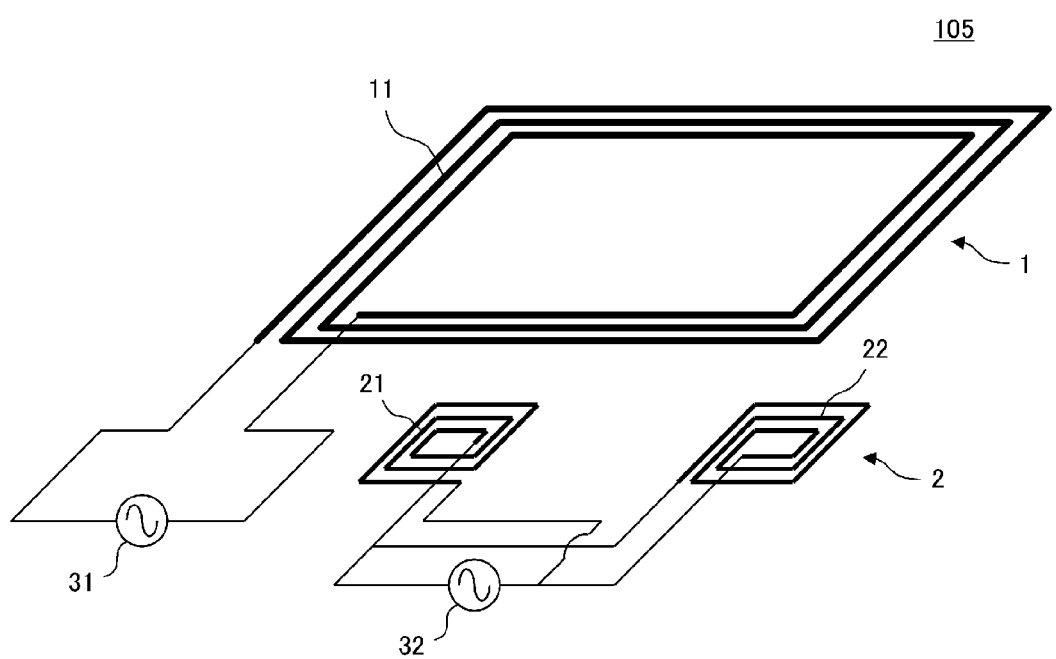
FIG. 12 is an exploded perspective view of an antenna device 105 of a fifth preferred embodiment of the present invention.

FIG. 12 is an exploded perspective view of an antenna device 105 of a fifth preferred embodiment of the present invention. Note that a base member is not illustrated. As illustrated in FIG. 1, in the first preferred embodiment, the first power supply circuit 31 is connected to the coil conductor 11 of the first coil antenna 1, and the second power supply circuit 32 is connected in series to the coil conductors 21 and 22 of the second coil antenna 2. However, in the example illustrated in FIG. 12, a second power supply circuit 32 is connected in parallel to coil conductors 21 and 22 of a second coil antenna 2. Here, a magnetic field induced by the coil conductor 21 and a magnetic field induced by the coil conductor 22 are connected to each other such that the directions thereof are opposite to each other with respect to a coil opening surface. In other words, the two coil conductors 21 and 22 are disposed and wound such that a magnetic field that is generated by applying a current to the two coil conductors 21 and 22 defines a closed magnetic circuit. Therefore, similarly to the above-described preferred embodiments, the first coil antenna 1 and the second coil antenna 2 are not coupled to each other.

Sixth Preferred Embodiment

Figure 13A:
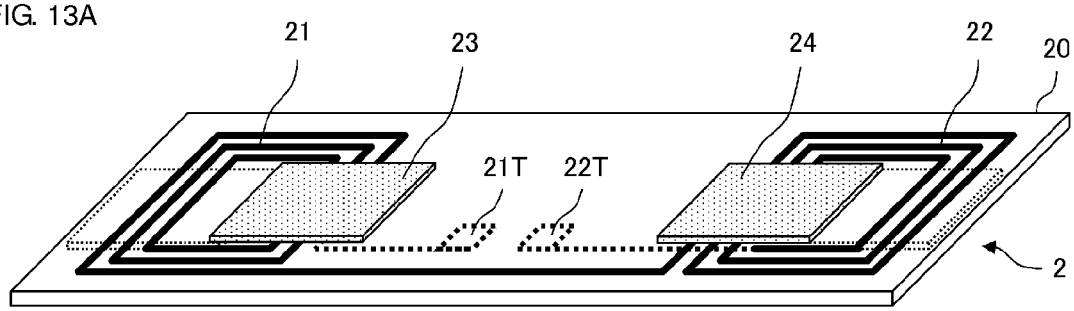
FIG. 13A is a perspective view of a second coil antenna of an antenna device 106 according to a sixth preferred embodiment of the present invention.
Figure 13B:
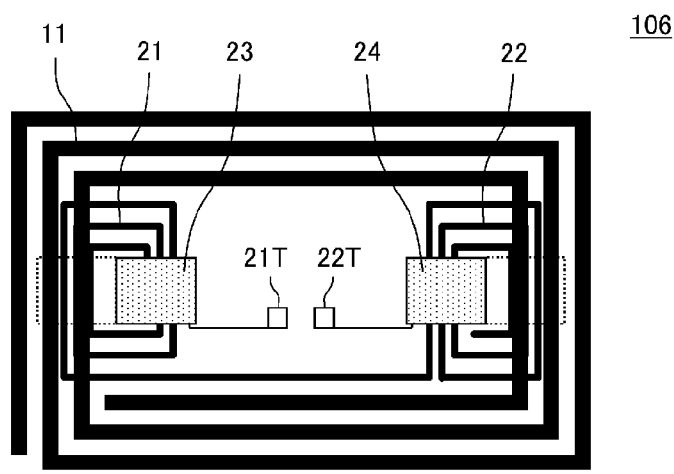
FIG. 13B is a plan view of the antenna device 106.
Figure 13C:
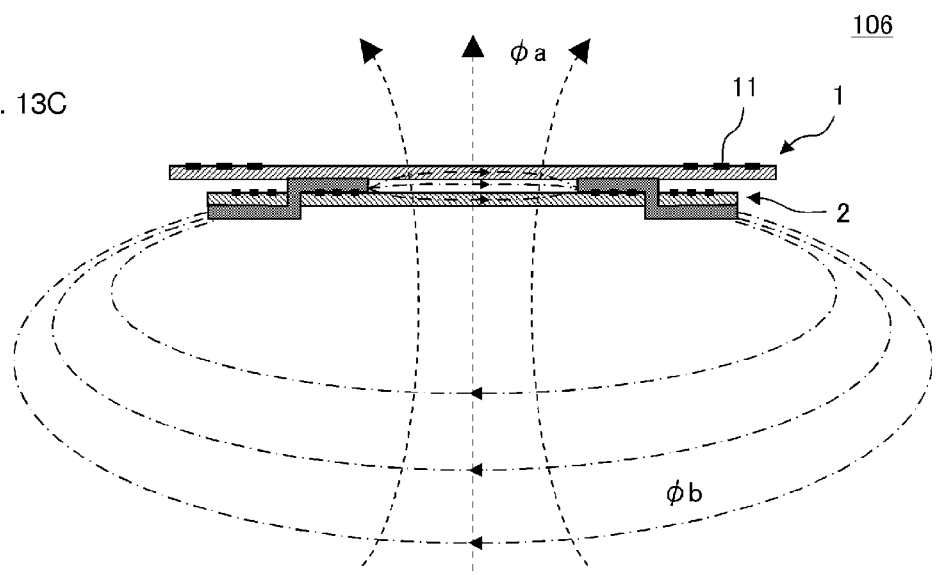
FIG. 13C is a front view of the antenna device 106.

FIG. 13A is a perspective view of a second coil antenna of an antenna device 106 according to a sixth preferred embodiment of the present invention. FIG. 13B is a plan view of the antenna device 106. Note that a support base member that forms coil conductors is illustrated as being transparent. FIG. 13C is a front view of the antenna device 106.

As illustrated in FIG. 13A, coil conductors 21 and 22 of a second coil antenna 2 are located on a base member 20, and ferrite sheets 23 and 24 are inserted so as to obliquely pass through coil openings of the coil conductors 21 and 22. Slit-shaped holes into which the ferrite sheets 23 and 24 are to be inserted are formed in the base member 20. The coil conductors 21 and 22 are electrically connected in series, and end portions of the coil conductors 21 and 22 are arranged to define connection terminals 21T and 22T. A coil conductor 11 of a first coil antenna preferably is the same or substantially the same as those described in the above-described preferred embodiments.

As illustrated in FIG. 13C, a magnetic flux φb that is induced by a current that flows through the coil conductors 21 and 22 of the second coil antenna 2 defines loops (a closed magnetic circuit) that penetrate in series the two ferrite sheets 23 and 24. A closed magnetic circuit defined by the coil conductors 21 and 22 of the second coil antenna 2 circulates in or substantially in an area inside a first coil antenna 1 (the coil conductor 11) (in a coil opening). A magnetic flux φa that is induced by a current that flows through the coil conductor 11 of the first coil antenna 1 is oriented in a direction perpendicular or substantially perpendicular to a coil opening surface of the coil conductor 11. Therefore, the first coil antenna 1 and the second coil antenna 2 are not coupled to each other.

According to this sixth preferred embodiment, ferrite sheets that obliquely pass through coil openings of the coil conductors 21 and 22 are provided, so that the magnetic flux φb is widely extended in a necessary direction, and directivity and gain are increased.

Seventh Preferred Embodiment

Figure 14A:
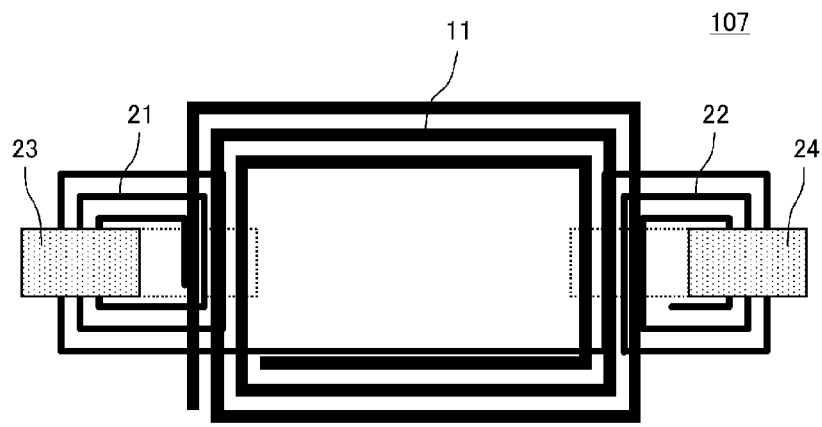
FIG. 14A is a plan view of an antenna device 107 according to a seventh preferred embodiment of the present invention.
Figure 14B:
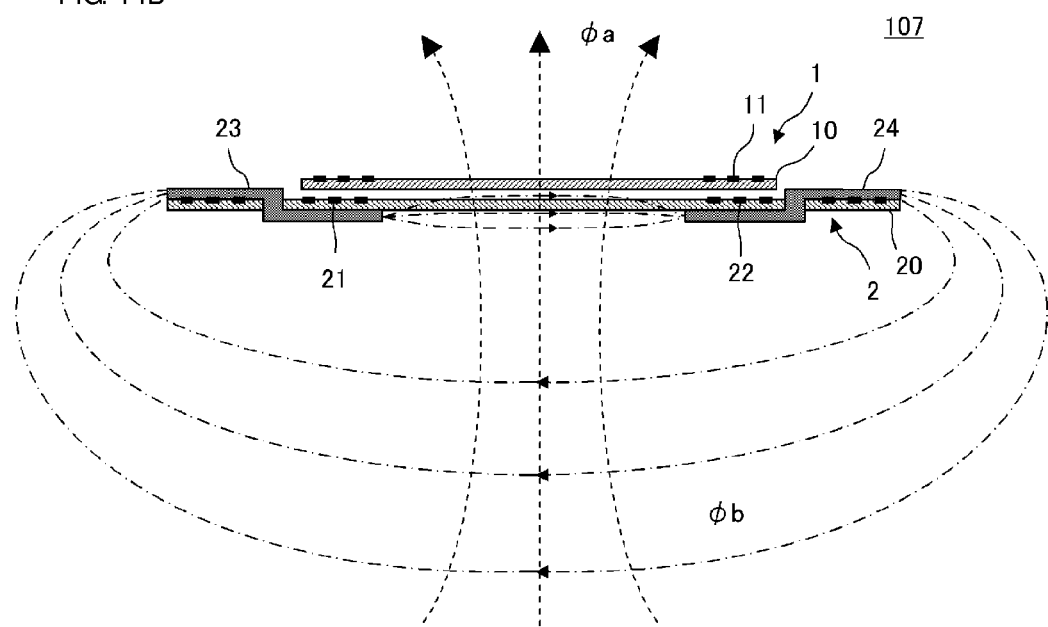
FIG. 14B is a front view of the antenna device 107.

FIG. 14A is a plan view of an antenna device 107 according to a seventh preferred embodiment of the present invention. Note that a support base member that defines coil conductors is illustrated as being transparent. FIG. 14B is a front view of the antenna device 107.

As illustrated in FIG. 14A, coil conductors 21 and 22 of a second coil antenna 2 is located on a base member 20, and ferrite sheets 23 and 24 are inserted so as to obliquely pass through the coil openings of the coil conductors 21 and 22. Slit-shaped holes into which the ferrite sheets 23 and 24 are to be inserted are formed in the base member 20. The coil conductors 21 and 22 are electrically connected in series. A direction in which the ferrite sheets 23 and 24 are inserted is different from that of the example illustrated in FIG. 13. A coil conductor 11 of a first coil antenna is preferably the same or substantially the same as those described in the above-described preferred embodiments.

As illustrated in FIG. 14B, a magnetic flux φb that is induced by a current that flows through the coil conductors 21 and 22 of the second coil antenna 2 defines loops (a closed magnetic circuit) that penetrate in series the two ferrite sheets 23 and 24. A closed magnetic circuit defined by the coil conductors 21 and 22 of the second coil antenna 2 circulates in or substantially in an area outside a first coil antenna 1 (the coil conductor 11) via the coil conductor 11 of the first coil antenna 1, that is, such that loops of a magnetic field of the closed magnetic circuit are partially superposed with the coil conductor 11 when seen in plan view. A magnetic flux φa that is induced by a current that flows through the coil conductor 11 of the first coil antenna 1 is oriented in a direction perpendicular or substantially perpendicular to a coil opening surface of the coil conductor 11. Therefore, the first coil antenna 1 and the second coil antenna 2 are not coupled to each other.

Note that the first coil antenna 1 is disposed in an area located between positions at which the ferrite sheets 23 and 24 are exposed toward the upper side of FIG. 14B, so that the thickness dimension of the antenna device 107 is within a limited range.

Eighth Preferred Embodiment

An antenna device 108 according to an eighth preferred embodiment will be described with sequential reference to the drawings.

Figure 15:
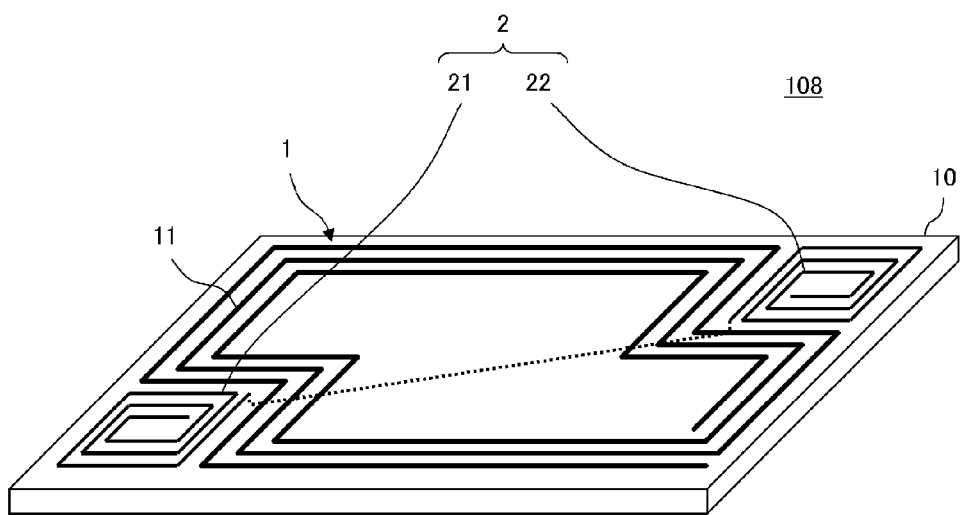
FIG. 15 is an external perspective view of an antenna device 108.
Figure 16A:
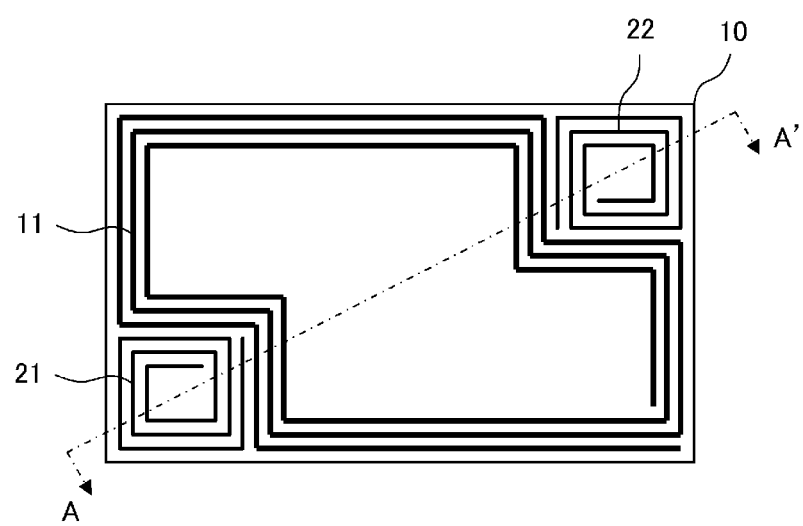
FIG. 16A is a plan view of the antenna device 108.

FIG. 15 is an external perspective view of the antenna device 108. FIG. 16A is a plan view of the antenna device 108, and FIG. 16B is a front view of the antenna device 108.

This antenna device 108 includes a first coil antenna 1 and a second coil antenna 2. The first coil antenna 1 is one in which a coil conductor 11 having a rectangular or substantially rectangular spiral shape is located on a non-magnetic insulating base member 10. The second coil antenna 2 is one in which two coil conductors 21 and 22 are located on the base member 10. The two coil conductors 21 and 22 of the second coil antenna 2 are connected to a wiring line (a dotted line portion in FIG. 15) that are located on a surface of the base member 10 on the opposite side to the surface of the base member 10 on which the two coil conductors 21 and 22 are located through via hole conductors (not illustrated) that connect the coil conductors 21 and 22 and the wiring line and the wiring line. These two coil conductors 21 and 22 are disposed and wound such that a closed magnetic circuit that is defined by a magnetic field generated by applying a current to the coil conductors 21 and 22 circulates in a coil opening of the coil conductor 11 of the first coil antenna 1.

Figure 16B:
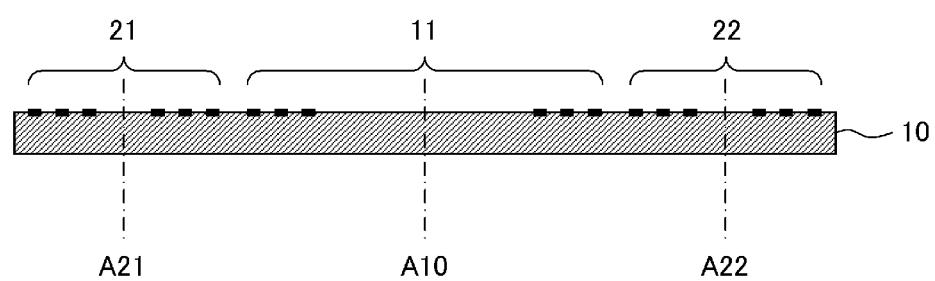
FIG. 16B is a front view of the antenna device 108.

As illustrated in FIG. 16B, winding axes A21 and A22 of the two coil conductors 21 and 22 of the second coil antenna 2 and a winding axis A10 of the coil conductor 11 of the first coil antenna 1 are parallel or substantially parallel to one another. In other words, the winding axis directions match one another. In other words, the winding axis of the coil conductor 11 of the first coil antenna 1 is parallel or substantially parallel to a plane that includes the winding axes of the two coil conductors 21 and 22 of the second coil antenna 2 (a plane perpendicular or substantially perpendicular to a surface of the base member 10). In this example, the winding axis of the coil conductor 11 is present in the plane that includes the winding axes of the coil conductors 21 and 22.

In addition, a region in which the first coil antenna 1 is located and regions in which the second coil antenna 2 is arranged to have a positional relationship in which the region in which the first coil antenna 1 is located is interposed between the regions in which the second coil antenna 2 is located in or substantially in a plane (in the surface of the base member 10 in this example).

Figure 17A:
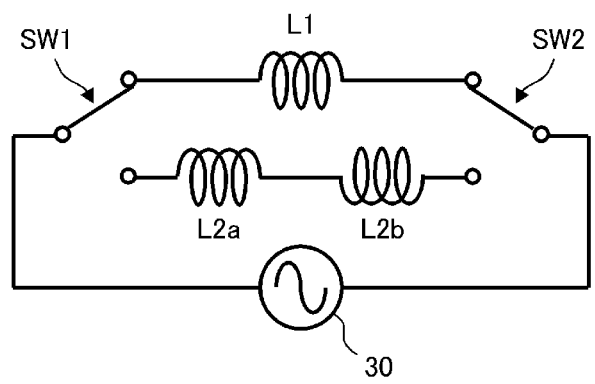
FIG. 17A and FIG. 17B are circuit diagrams illustrating two connection states of a power supply circuit 30 to the antenna device 108.
Figure 17B:
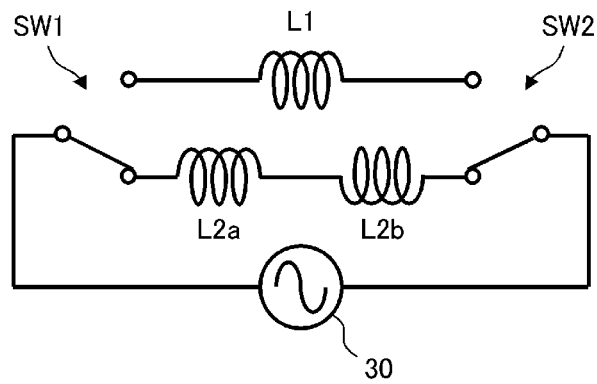
Figure 18A:
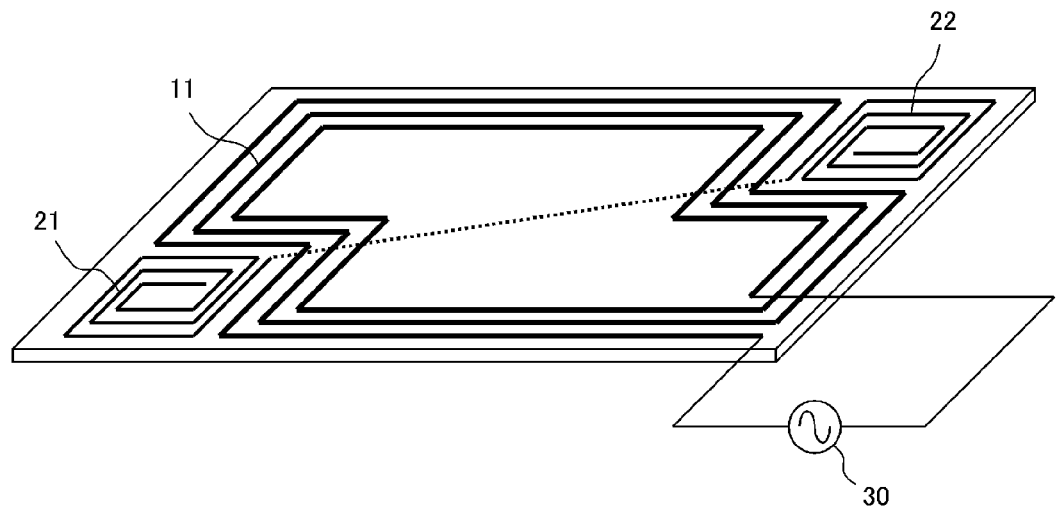
FIG. 18A and FIG. 18B are circuit diagrams illustrating two connection states of the power supply circuit 30 to the antenna device 108.
Figure 18B:
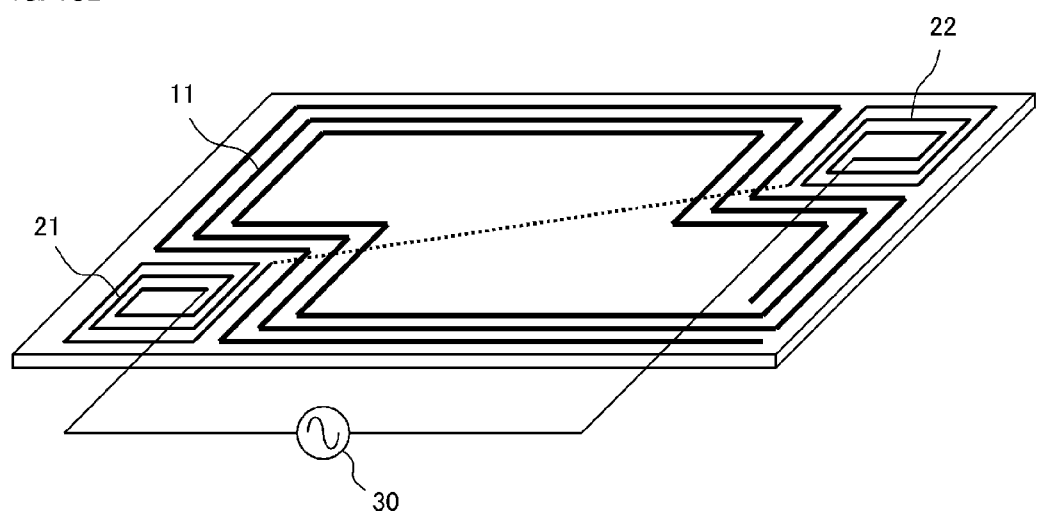

FIG. 17 and FIG. 18 are diagrams illustrating connection states of a power supply circuit 30 to the antenna device 108. In FIG. 17, an inductor L1 corresponds to the coil conductor 11 of the first coil antenna 1, and inductors L2a and L2b correspond to the coil conductors 21 and 22 of the second coil antenna 2, respectively. As illustrated in FIG. 17A and FIG. 18A, a power supply circuit 30 is connected to the antenna device via switches SW1 and SW2. In the states illustrated in FIG. 17A and FIG. 18A, power is supplied to the first coil antenna 1, and in the states illustrated in FIG. 17B and FIG. 18B, power is supplied to the second coil antenna 2.

Figure 19A:
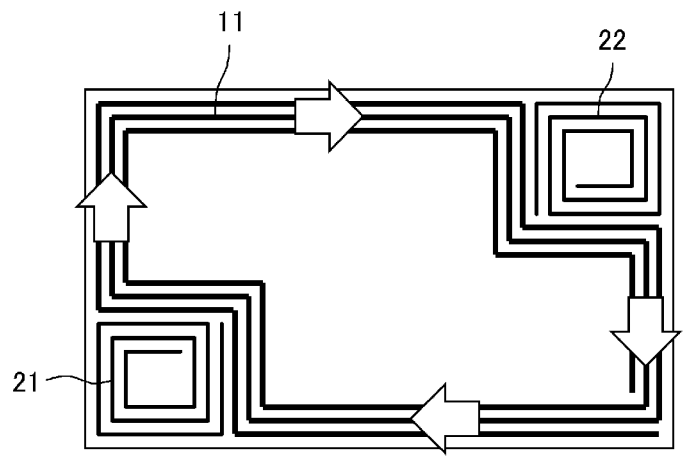
FIG. 19A and FIG. 19B are diagrams illustrating states of currents that flow through coil conductors of the antenna device 108.
Figure 19B:
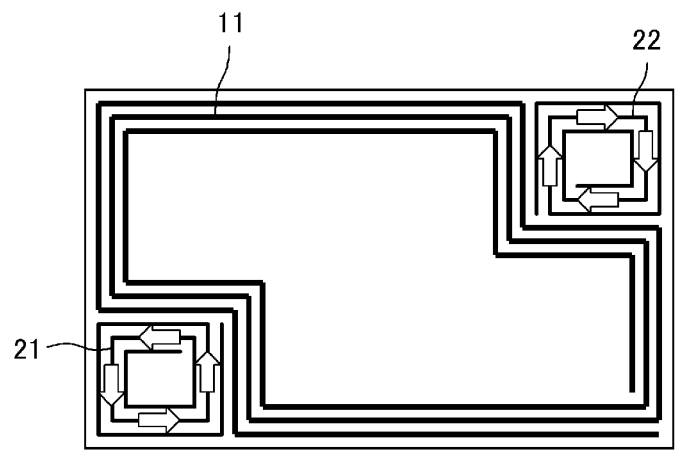
Figure 20A:
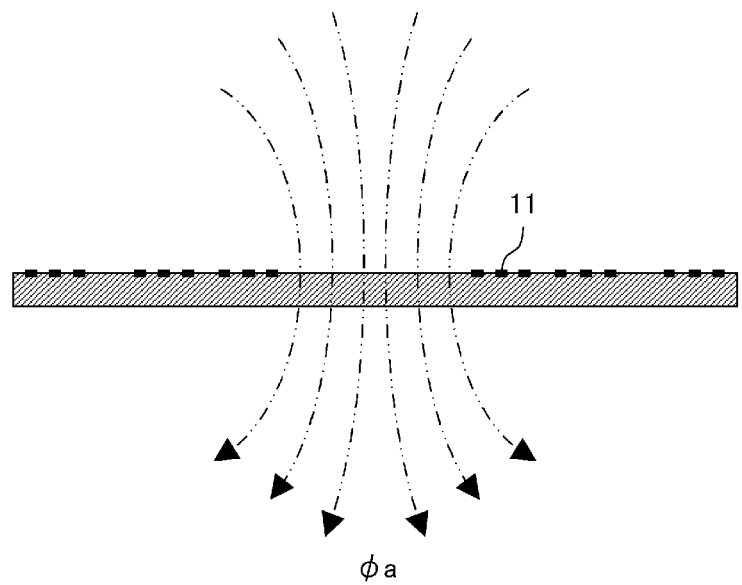
FIG. 20A and FIG. 20B are diagrams illustrating states of magnetic fields that are induced by the coil conductors of the antenna device 108.
Figure 20B:
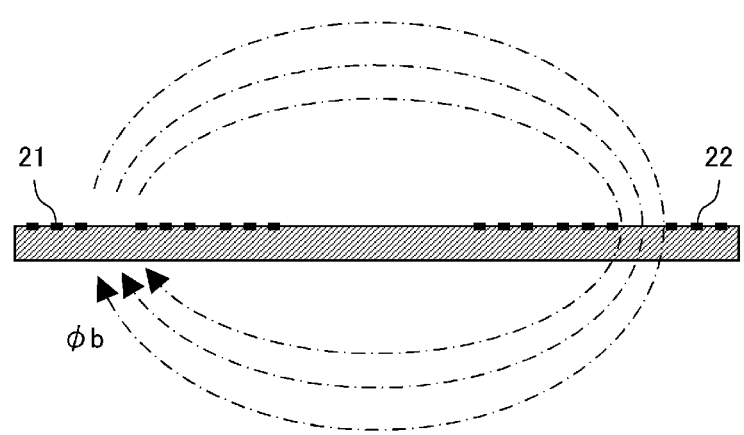

FIG. 19 is a diagram illustrating states of currents that flow through the coil conductors of the antenna device 108. FIG. 20 is a diagram illustrating states of magnetic fields that are induced by the coil conductors of the antenna device 108. Each of FIG. 19A and FIG. 20A illustrates a state in which power is supplied to the coil conductor 11 of the first coil antenna 1, and each of FIG. 19B and FIG. 20B illustrates a state in which power is supplied to the coil conductors 21 and 22 of the second coil antenna 2.

When a current flows through the coil conductor 11 of the first coil antenna 1 as illustrated in FIG. 19A, a magnetic field such as that represented by the magnetic flux $\phi a$ in FIG. 20A is generated. When a current flows through the coil conductors 21 and 22 of the second coil antenna 2 as illustrated in FIG. 19B, a magnetic field that is a closed magnetic circuit such as that represented by the magnetic flux $\phi b$ in FIG. 20(B) is generated. The magnetic field (a closed magnetic circuit) of the coil conductors 21 and 22 of the second coil antenna 2 circulates in an area outside the coil conductor 11 of the first coil antenna 1 via the coil conductor 11 of the first coil antenna 1, that is, in such a manner that loops of a magnetic field of the closed magnetic circuit are partially superposed with the coil conductor 11 when seen in plan view. As a result, the magnetic flux of the coil conductors 21 and 22 does not link with the coil conductor 11, and the second coil antenna 2 will not be coupled to the first coil antenna. Therefore, although the two coil antennas are adjacent to each other, mutual interference between the two coil antennas is suppressed.

As described above, a magnetic flux that is induced by applying a current to the coil conductors 21 and 22 of the second coil antenna 2 forms loops so as to define a closed magnetic circuit. The winding axis of the coil conductor 11 of the first coil antenna 1 is present in a plane that includes the winding axes of the two coil conductors 21 and 22 of the second coil antenna 2.

Figure 21A:
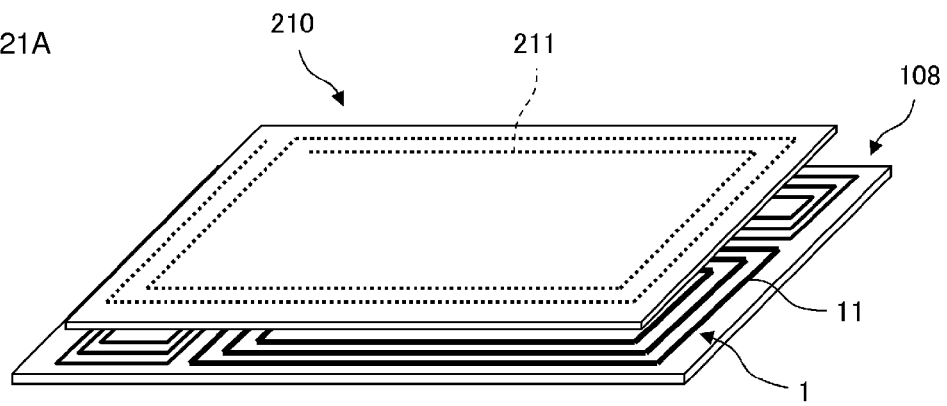
FIG. 21A and FIG. 21B are diagrams illustrating positional relationships between the antenna device 108 and an IC card (tag), which is a communication partner, when the antenna device 108 communicates with the IC card (tag).
Figure 21B:
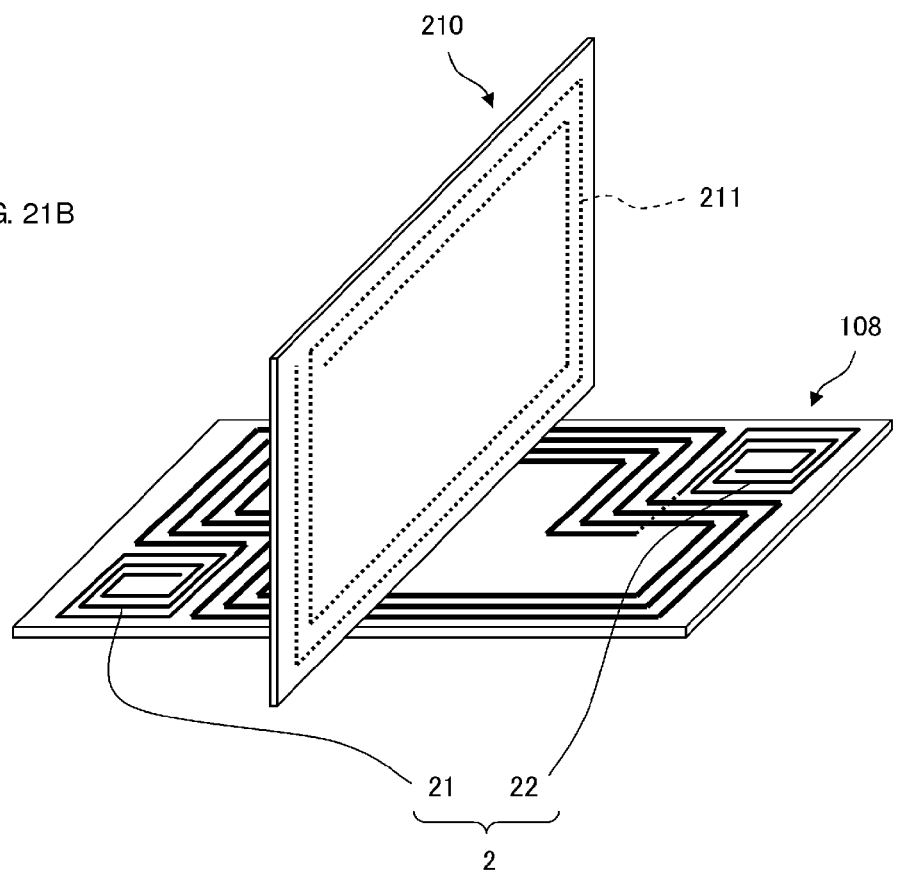

FIGS. 21A and 21B are diagrams illustrating positional relationships between the antenna device 108 and an IC card (tag), which is a communication partner, when the antenna device 108 communicates with the IC card (tag). FIG. 21A is a diagram illustrating a communication state in which the first coil antenna 1 is used, and FIG. 21B is a diagram illustrating a communication state in which the second coil antenna 2 is used. A coil antenna 211 is preferably provided in the IC card (tag) 210.

As illustrated in FIG. 21A, in a state in which the IC card (tag) 210, which is a communication partner, and an antenna device 108 are parallel or substantially parallel to each other, the first coil antenna 1 is used, so that the coil antenna 211 of the IC card (tag) 210 links with the magnetic flux $\phi a$ illustrated in FIG. 20A, and as a result, communication is performed. As illustrated in FIG. 21B, in a state in which the IC card (tag) 210 and the antenna device 108 are perpendicular or substantially perpendicular to each other, the second coil antenna 2 is used, so that the coil antenna 211 of the IC card (tag) 210 links with the magnetic flux $\phi b$ illustrated in FIG. 20(B), and as a result, communication is performed.

Ninth Preferred Embodiment

Figure 22A:
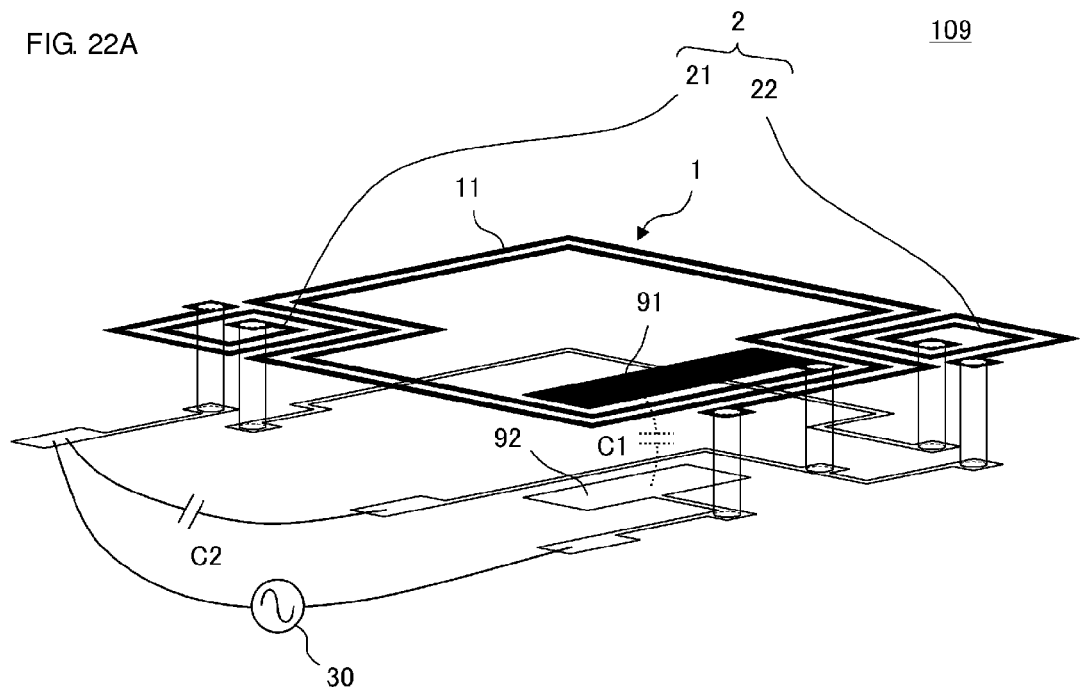
FIG. 22A is a perspective view of an antenna device 109 of a ninth preferred embodiment of the present invention.

FIG. 22A is a perspective view of an antenna device 109 of a ninth preferred embodiment of the present invention. Note that a base member is not illustrated. In this example, a coil conductor 11 of a first coil antenna 1 and coil conductors 21 and 22 of a second coil antenna 2 are connected in series.

As illustrated in FIG. 22A, the coil conductor 11 of the first coil antenna 1 and the coil conductors 21 and 22 of the second coil antenna 2 are located on an upper layer (a top surface), and patterns that are electrically connected to the coil conductors are located on a lower layer (a bottom surface). Each of the coil conductors on the upper layer (the top surface) and a corresponding one of the patterns on the lower layer (the bottom surface) are connected to each other through a via conductor.

Figure 22B:
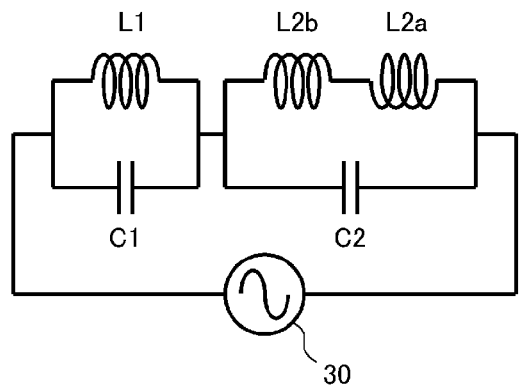
FIG. 22B is an equivalent circuit diagram of the antenna device 109.

FIG. 22B is an equivalent circuit diagram of the antenna device 109. An inductor L1 corresponds to the coil conductor 11 of the first coil antenna 1, and inductors L2a and L2b correspond to the coil conductors 21 and 22 of the second coil antenna 2, respectively. A capacitor C1 is a capacitor that includes an electrode 91 on the upper layer (the top surface) and an electrode 92 on the lower layer (the bottom surface). A capacitor C2 is an external component such as a chip capacitor. An LC parallel resonator includes the inductor L1 and the capacitor C1, and another LC parallel resonator includes the inductors (L2a and L2b) and the capacitor C2. The resonant frequencies of both the resonators are equal to a carrier frequency of a communication signal or are a frequency near the carrier frequency.

Figure 23:
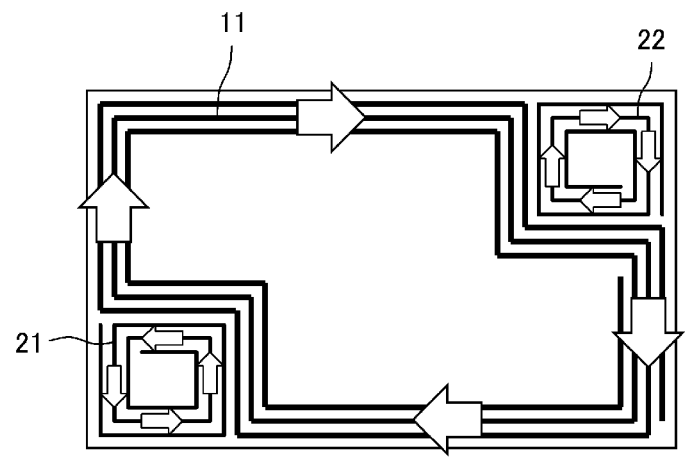
FIG. 23 is a diagram illustrating states of currents that flow through coil conductors of the antenna device 109.
Figure 24:
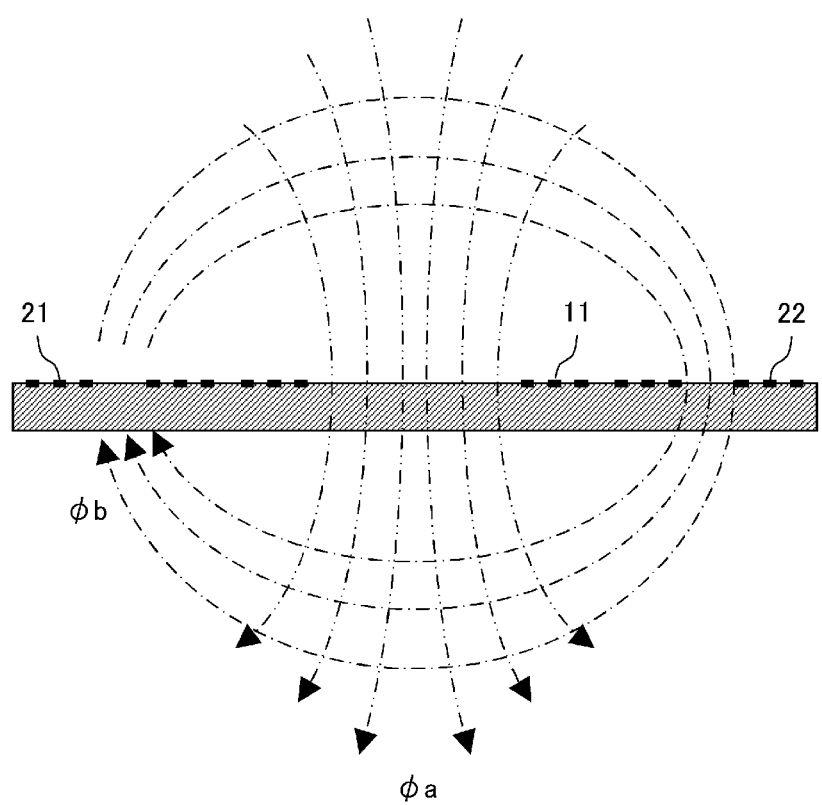
FIG. 24 is a diagram illustrating states of magnetic fields that are induced by the coil conductors of the antenna device 108.

FIG. 23 is a diagram illustrating states of currents that flow through the coil conductors of the antenna device 109, and FIG. 24 is a diagram illustrating states of magnetic fields that are induced by the coil conductors of the antenna device 109. FIG. 23 illustrates a state in which power is supplied to the coil conductor 11 of the first coil antenna 1 and the coil conductors 21 and 22 of the second coil antenna 2.

As illustrated in FIG. 23, a magnetic field such as that represented by the magnetic flux φa in FIG. 24 is induced by a current that flows through the coil conductor 11 of the first coil antenna 1. As illustrated in FIG. 23, a magnetic field such as that represented by the magnetic flux φb in FIG. 24 is induced by a current that flows through the coil conductors 21 and 22 of the second coil antenna 2. Therefore, as is the case of the first preferred embodiment, a magnetic flux that is generated by the first coil antenna 1 or a magnetic flux that links with the first coil antenna 1 and a magnetic flux that is generated by the second coil antenna 2 or a magnetic flux that links with the second coil antenna 2 are substantially perpendicular to each other.

As described above, a power supply circuit 30 may be connected in series to the first coil antenna 1 and the second coil antenna 2 so as to supply power to the first coil antenna 1 and the second coil antenna 2 at the same time. Similarly, the power supply circuit 30 may be connected in parallel to the first coil antenna 1 and the second coil antenna 2 so as to supply power to the first coil antenna 1 and the second coil antenna 2 at the same time.

Tenth Preferred Embodiment

Figure 25A:
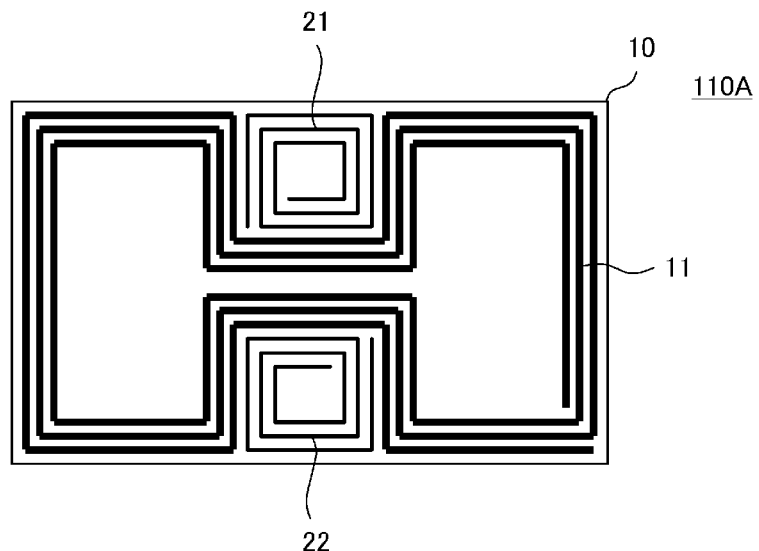
FIG. 25A, FIG. 25B, and FIG. 25C are diagrams illustrating configurations of three antenna devices according to a tenth preferred embodiment of the present invention.
Figure 25B:
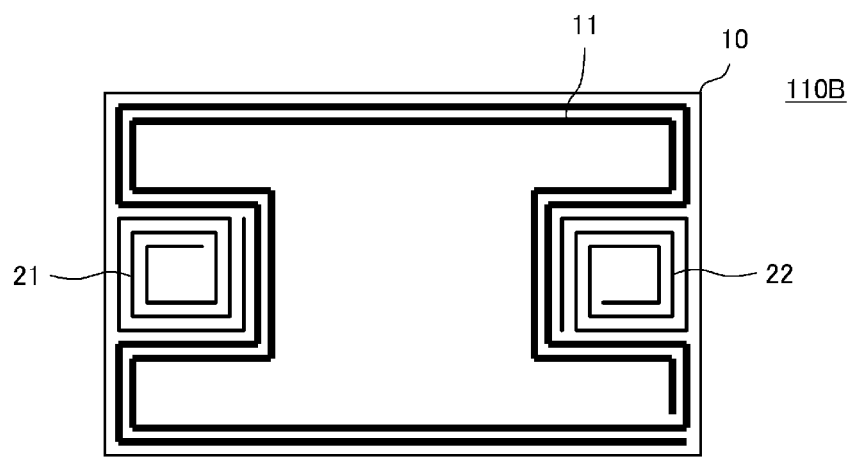
Figure 25C:
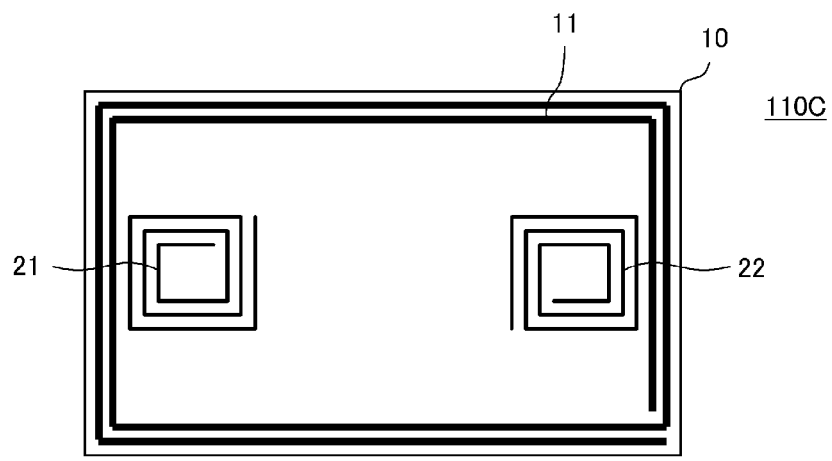

FIGS. 25A-25C are diagrams illustrating configurations of three antenna devices according to a tenth preferred embodiment of the present invention. FIG. 25A is a plan view of an antenna device 110A, FIG. 25B is a plan view of an antenna device 110B, and FIG. 25C is a plan view of an antenna device 110C. In an example illustrated in FIG. 25A, a coil conductor 21 of a second coil antenna is located at the center of one of two long sides of a base member 10, and a coil conductor 22 of the second coil antenna is located at the center of the other one of the long sides. In addition, a coil conductor 11 of the first coil antenna is arranged along the periphery of the base member 10 so as to bypass the two coil conductors 21 and 22. Note that, in the similar manner to the first preferred embodiment, the two coil conductors 21 and 22 of the second coil antenna are connected to a wiring line that are located on a surface of the base member 10 on the opposite side to the surface of the base member 10 on which the two coil conductors 21 and 22 are located through via hole conductors that connect the coil conductors 21 and 22 and the wiring line and the wiring line. In an example illustrated in FIG. 25B, the coil conductor 21 of the second coil antenna is located at the center of one of two short sides of the base member 10, and the coil conductor 22 of the second coil antenna is located at the center of the other one of the short sides. In addition, the coil conductor 11 of the first coil antenna is arranged along the periphery of the base member 10 so as to bypass the two coil conductors 21 and 22. In an example illustrated in FIG. 25C, the coil conductor 21 of the second coil antenna is located near the center of one of two short sides of the base member 10, and the coil conductor 22 of the second coil antenna is located near the center of the other one of the short sides. The coil conductor 11 of the first coil antenna is arranged along the periphery of the base member 10 so as to bypass the two coil conductors 21 and 22.

As described above, the coil conductor 11 of the first coil antenna and the coil conductors 21 and 22 of the second coil antenna are disposed in a rectangular or substantially rectangular area, so that, in a manner similar to the first and second preferred embodiments, an antenna device is provided and contained in a limited area. In addition, as described above, the coil conductor 11 of the first coil antenna and the coil conductors 21 and 22 of the second coil antenna are located on the same base member, so that an antenna device is further reduced in thickness. Furthermore, the handling ability at the time of manufacturing and assembling is improved.

Eleventh Preferred Embodiment

Figure 26A:
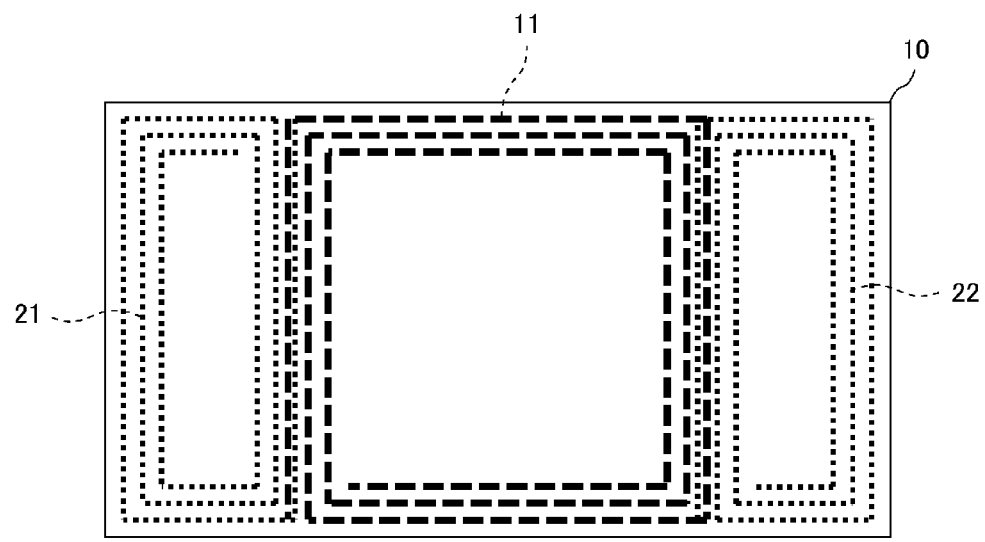
FIG. 26A is a plan view of an antenna device 111 according to an eleventh preferred embodiment of the present invention.
Figure 26B:
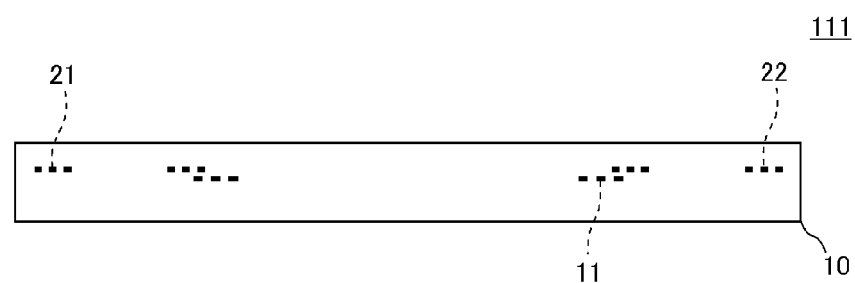
FIG. 26B is a sectional front view of the antenna device 111.

FIG. 26A is a plan view of an antenna device 111 according to an eleventh preferred embodiment of the present invention, and FIG. 26B is a sectional front view of the antenna device 111. In the antenna device 111, a coil conductor 11 of a first coil antenna and coil conductors 21 and 22 of a second coil antenna are located in or on a base member 10. The base member 10 is manufactured by a method of manufacturing a resin multilayer substrate. The two coil conductors 21 and 22 are disposed and wound such that a magnetic field generated by applying a current to the two coil conductors 21 and 22 defines a closed magnetic circuit that is perpendicular or substantially perpendicular to a magnetic field induced by the coil conductor 11. The closed magnetic circuit generated by the coil conductors 21 and 22 of the second coil antenna 2 circulates in or substantially in an area outside the first coil antenna 1 (the coil conductor 11) via the coil conductor 11 of the first coil antenna 1, that is, in such a manner that loops of a magnetic field of the closed magnetic circuit are partially superposed with the coil conductor 11 when seen in plan view.

As described above, the coil conductor 11 of the first coil antenna and the coil conductors 21 and 22 of the second coil antenna may be formed on different layers of the same base member. As a result, an antenna device that is thin and that has a small plane size is provided. Note that a resin casing of an electronic device such as a cellular phone terminal may be used as the base member 10 of the present preferred embodiment, for example.

Twelfth Preferred Embodiment

Figure 27:
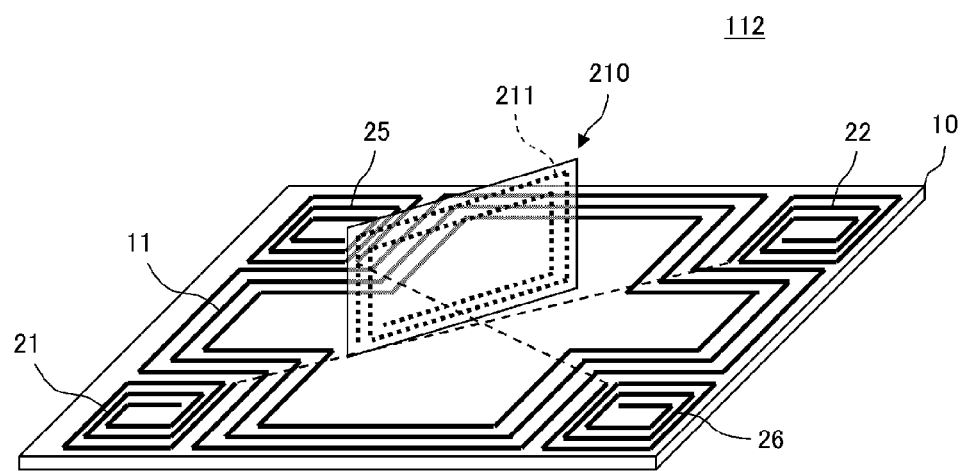
FIG. 27 is an external perspective view of an antenna device 112 according to a twelfth preferred embodiment of the present invention.

FIG. 27 is an external perspective view of an antenna device 112 according to a twelfth preferred embodiment of the present invention. The antenna device 112 includes a non-magnetic insulating base member 10 and coil conductors that are located on the base member 10. In other words, a coil conductor 11 having a cross shape and a spiral shape and four coil conductors 21, 22, 25, and 26 each having a spiral shape, for example, are located on the base member 10. A first coil antenna includes the coil conductor 11, and a second coil antenna includes the coil conductors 21, 22, 25, and 26.

The coil conductors 21 and 22 are connected to a wiring line (a dotted line portion in FIG. 27) that is located on a surface of the base member 10 on the opposite side to the surface of the base member 10 on which the two coil conductors 21 and 22 are located through via hole conductors (not illustrated) that connect the coil conductors 21 and 22 and the wiring line. Similarly, the coil conductors 25 and 26 are connected to a wiring line (a dotted line portion in FIG. 27) that is located on a surface of the base member 10 on the opposite side to the surface of the base member 10 on which the two coil conductors 25 and 26 are located through via hole conductors (not illustrated) that connect the coil conductors 25 and 26 and the wiring line.

The above-described two coil conductors 21 and 22 are disposed and wound such that a closed magnetic circuit that is defined by a magnetic field generated by applying a current to the two coil conductors 21 and 22 circulates in the periphery of the coil conductor 11 of the first coil antenna 1. Similarly, the two coil conductors 25 and 26 are disposed and wound such that a closed magnetic circuit that is defined by a magnetic field generated by applying a current to the two coil conductors 25 and 26 circulates in the periphery of the coil conductor 11 of the first coil antenna 1.

FIG. 27 illustrates an IC card (tag) 210, which is a communication partner. In a state illustrated in FIG. 27, a coil antenna 211 of the IC card 210 links with a magnetic field generated by the coil conductors 25 and 26. Therefore, the IC card 210 and a power supply circuit that is connected to the coil conductors 25 and 26 have an electromagnetic field coupling relationship.

Figure 28:
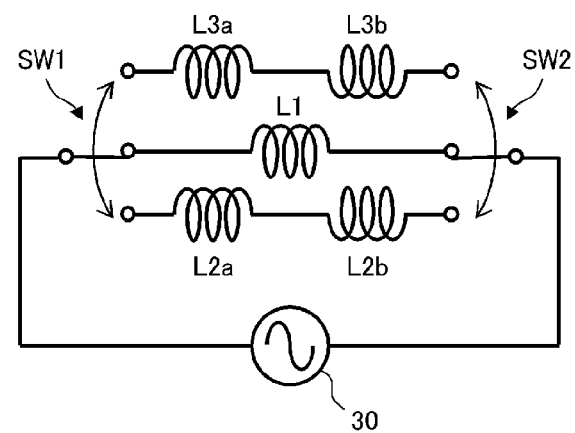
FIG. 28 is a diagram illustrating a connection state of the power supply circuit 30 to the antenna device 112.

FIG. 28 is a diagram illustrating a connection state of a power supply circuit 30 to the antenna device 112. In FIG. 28, an inductor L1 corresponds to the coil conductor 11, inductors L2a and L2b correspond to the coil conductors 21 and 22, and inductors L3a and L3b correspond to the coil conductors 25 and 26, respectively. A power supply circuit 30 is connected to the antenna device 112 via switches SW1 and SW2. As described above, a coil conductor to be used may be selected by performing switching of switches.

Figure 29:
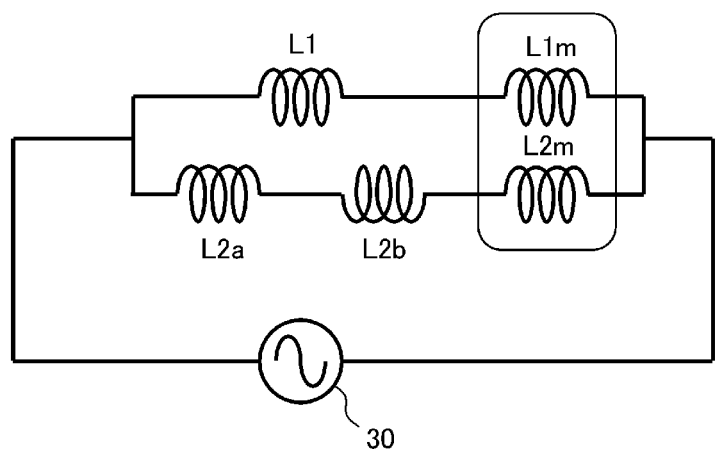
FIG. 29 is a diagram illustrating another connection state of the power supply circuit 30 to the antenna device 112 illustrated in FIG. 27.

FIG. 29 is a diagram illustrating another connection state of the power supply circuit 30 to the antenna device 112 illustrated in FIG. 27. In FIG. 29, an inductor L1 corresponds to the coil conductor 11, inductors L2a and L2b correspond to the coil conductors 21 and 22, and inductors L1m and L2m correspond to the coil conductors 25 and 26, respectively. As described above, a series circuit of the coil conductors 21 and 22 and the coil conductor 11 may be connected in parallel via other coil conductors (25 and 26). Alternatively, the inductances of two series circuits may be adjusted so as to be equal or approximately equal to each other by connecting in series the coil conductors 25 and 26 to the series circuit of the coil conductors 21 and 22 and the coil conductor 11, respectively. As described above, power is supplied to the coil conductors 11, 21, 22, 25, and 26 at the same time, so that non-directivity is obtained.

Note that, here, although all of the second coil antennas (antennas of the closed magnetic circuits) are disposed in areas outside the first coil antenna (an antenna of an open magnetic circuit), all of the second coil antennas may be disposed in an area inside the first coil antenna. Alternatively, one of the two pairs of closed magnetic circuits may be disposed in an area inside the first coil antenna, and the other one of the two pairs of closed magnetic circuits may be disposed in an area outside the first coil antenna.

In addition, although the antennas of the closed magnetic circuits are disposed in four corners of the antenna of the open magnetic circuit in the example illustrated in FIG. 27, the antennas of the closed magnetic circuits may be disposed in the center of four sides of the antenna of the open magnetic circuit.

Thirteenth Preferred Embodiment

Figure 30A:
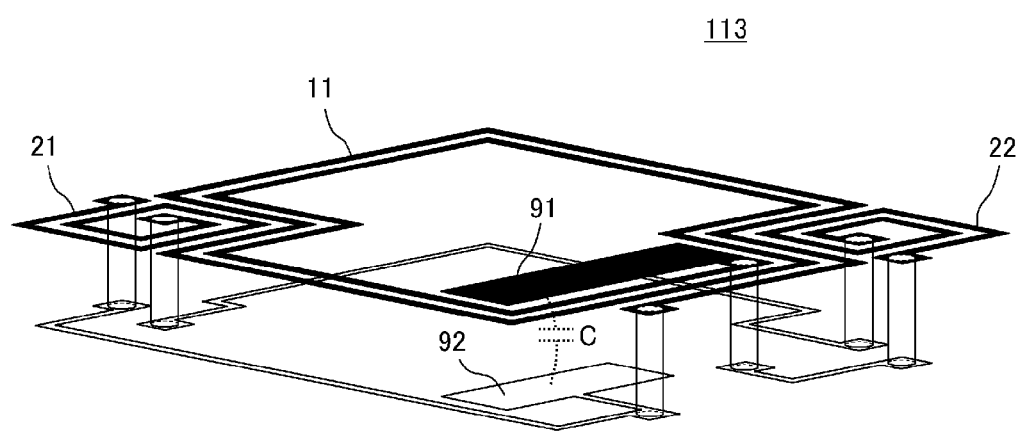
FIG. 30A is a perspective view of a booster antenna 113.
Figure 30B:
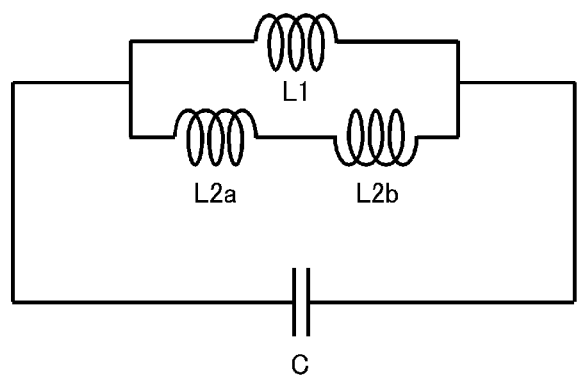
FIG. 30B is an equivalent circuit diagram of the booster antenna 113.

In a thirteenth preferred embodiment of the present invention, an antenna device that includes a power supply coil and a booster antenna will be described. FIG. 30A is a perspective view of a booster antenna 113, and FIG. 30B is an equivalent circuit diagram of the booster antenna 113. Note that a base member is not illustrated. In FIG. 30B, an inductor L1 corresponds to the coil conductor 11, and inductors L2a and L2b correspond to the coil conductors 21 and 22, respectively. A capacitor C is a capacitor that includes an electrode 91 on an upper layer (a top surface) and an electrode 92 on a lower layer (a bottom surface). In this example, a coil conductor 11 of a first coil antenna and coil conductors 21 and 22 of a second coil antenna are connected in parallel, and in addition, the capacitor C is connected in parallel to the coil conductors. As a result, a resonant booster antenna is provided. The resonant frequency of this resonant booster antenna is set to a carrier frequency of a communication system or a frequency near the carrier frequency. Note that, in order to adjust the above-mentioned resonant frequency, an inductor other than the above-described coil conductors may be provided.

Figure 31:
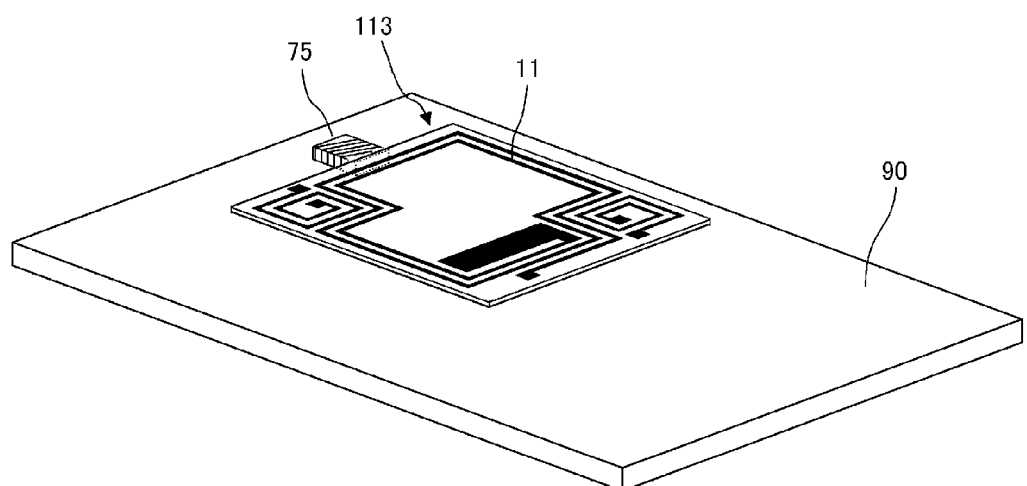
FIG. 31 is a perspective view of an antenna device according to a thirteenth preferred embodiment of the present invention.

FIG. 31 is a perspective view of an antenna device according to a thirteenth preferred embodiment of the present invention. An RFIC module 75 is mounted on a substrate 90, and the booster antenna 113 is disposed parallel or substantially parallel to the substrate 90 and around the vicinity of the RFIC module 75. The RFIC module 75 includes a power supply coil. The booster antenna 113 is attached to, for example, an inner surface of a casing.

In the RFIC module 75, the orientation and position of a coil winding axis of the power supply coil are set such that the power supply coil of the RFIC module 75 and one of or all of the coil conductors 11, 21, and 22 have a magnetic field coupling relationship. As a result, the power supply coil of the RFIC module 75 and the booster antenna 113 have an electromagnetic field coupling relationship.

Figure 32:
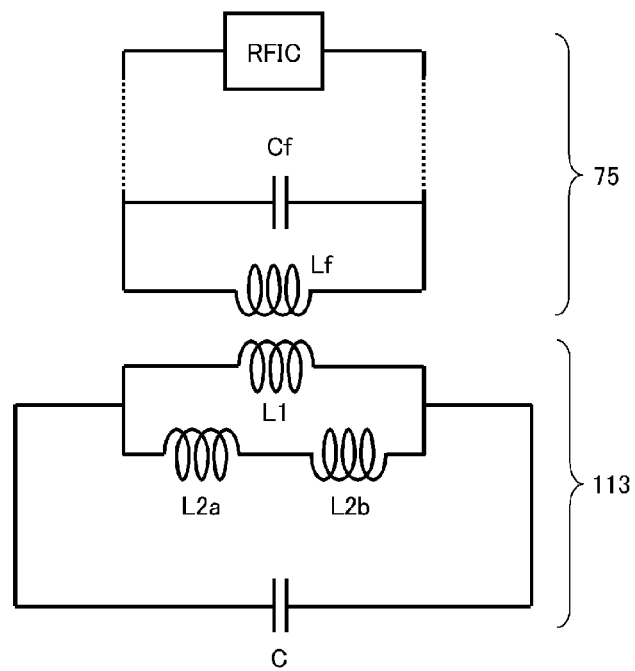
FIG. 32 is an equivalent circuit diagram of the antenna device according to the thirteenth preferred embodiment of the present invention.

FIG. 32 is an equivalent circuit diagram of the antenna device according to the thirteenth preferred embodiment. The configuration of the booster antenna 113 is illustrated in FIG. 30B. The RFIC module 75 includes an RFIC, the power supply coil, and a matching circuit. In FIG. 32, an inductor Lf corresponds to the power supply coil, and a capacitor Cf is a capacitor that adjusts resonant frequency. The matching circuit is not illustrated.

Although the case where the power supply coil (the inductor Lf) is coupled to the coil conductor 11 of the first coil antenna (the inductor L1) has been illustrated in FIG. 32, the power supply coil (the inductor Lf) may be coupled to one of the coil conductors 21 and 22 (the inductors L2a and L2b). Since the coil conductors 21 and 22 and the coil conductor 11 are connected in parallel, also in this case, the power supply coil and the booster antenna 113 have an electromagnetic field coupling relationship.

Note that, although the example in which the coil conductors 21 and 22 and the coil conductor 11 are connected in parallel has been described in this preferred embodiment, the coil conductors 21 and 22 and the coil conductor 11 may be independent of each other on the circuit.

Note that, although the example in which the winding axis of the coil conductor 11 of the first coil antenna 1 is present in the plane that includes the two winding axes of the coil conductors 21 and 22 of the second coil antenna 2, that is, the three winding axes are present in the same plane has been described in each of the above-described preferred embodiments, the present invention is not limited to this. The winding axis of the coil conductor 11 of the first coil antenna 1 is oriented in a direction that is the same or substantially the same as the direction in which the winding axes of the two coil conductors 21 and 22 of the second coil antenna 2 are oriented, and a closed magnetic circuit of the second coil antenna may circulate in or substantially in an area outside the coil conductor of the first coil antenna or may circulate in or substantially in an area inside the coil conductor of the first coil antenna such that the first coil antenna 1 and the second coil antenna 2 are not coupled to each other. For example, even if the winding axis of the coil conductor 11 of the first coil antenna 1 is not present in the plane that includes the two winding axes of the two coil conductors 21 and 22 of the second coil antenna 2 and is somewhat displaced, the winding axis of the coil conductor 11 of the first coil antenna 1 may be oriented in the direction that is the same or substantially the same as the direction in which the winding axes of the two coil conductors 21 and 22 of the second coil antenna 2 are oriented. As a result, loops of a magnetic field generated by applying a current to the two coil conductors of the second coil antenna can be made to be perpendicular or substantially perpendicular to the coil axis of the coil conductor of the first coil antenna. Therefore, an antenna device in which the first coil antenna 1 and the second coil antenna 2 do not interfere with each other even though the two coil antennas are adjacent to each other can be obtained. Note that, in the case where the above-described three winding axes are in the same plane, the loop of the magnetic field generated by applying a current to the two coil conductors of the second coil antenna can be made to be perpendicular or substantially perpendicular to the coil axis of the coil conductor of the first coil antenna with more certainty.

The coil conductors of the second coil antenna may be disposed via the coil conductor of the first coil antenna, that is, such that loops of a magnetic field of the closed magnetic circuit are partially superposed with the coil conductor 11 when seen in plan view.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
    a first coil antenna; and
    a second coil antenna that is disposed in a vicinity of the first coil antenna; wherein
    the first coil antenna includes one coil conductor;
    the second coil antenna includes two coil conductors wound such that a magnetic field that is generated by the two coil conductors defines a closed magnetic circuit;
    the two coil conductors of the second coil antenna are wound in a spiral shape when seen in a plan view from a direction of a winding axis of the coil conductor of the first coil antenna;
    the closed magnetic circuit is disposed in an area inside the coil conductor of the first coil antenna or is disposed in an area outside the coil conductor of the first coil antenna;
    the first coil antenna is configured for use in a first communication system; and
    the second coil antenna is configured for use in a second communication system.

2. The antenna device according to claim 1, wherein the first communication system and the second communication system are communication systems that use a same frequency band.

3. The antenna device according to claim 1, wherein the first coil antenna and the second coil antenna are arranged such that the winding axis of the coil conductor of the first coil antenna is present in a plane that includes the winding axes of the two coil conductors of the second coil antenna.

4. The antenna device according to claim 1, wherein a region in which the first coil antenna is located and a region in which the second coil antenna is located are at least partially superposed with each other when seen in plan view from winding axis directions of the winding axes of the two coil conductors of the second coil antenna and the winding axis of the coil conductor of the first coil antenna.

5. The antenna device according to claim 1, wherein
    the first coil antenna and the second coil antenna are positioned adjacent to each other such that a coil surface of each of the first and second coil antennas are positioned in a same plane; and
    the first coil antenna and the second coil antenna are used in one communication system.

6. The antenna device according to claim 5, wherein the coil conductor of the first coil antenna is interposed between the two coil conductors of the second coil antenna.

7. The antenna device according to claim 1, further comprising a power supply coil that is configured to be in at least a magnetic field coupling relationship with at least one of the first coil antenna and the second coil antenna.

8. A wireless communication device comprising:
    an antenna device that includes a first coil antenna and a second coil antenna disposed in a vicinity of the first coil antenna; wherein
    the first coil antenna includes one coil conductor;
    the second coil antenna includes two coil conductors wound such that a magnetic field that is generated by the two coil conductors defines a closed magnetic circuit;
    the two coil conductors of the second coil antenna are wound in a spiral shape when seen in a plan view from a direction of a winding axis of the coil conductor of the first coil antenna;
    the closed magnetic circuit is disposed in an area inside the coil conductor of the first coil antenna or is disposed in an area outside the coil conductor of the first coil antenna;
    the first coil antenna is configured for use in a first communication system; and
    the second coil antenna is configured for use in a second communication system.

9. The wireless communication device according to claim 8, wherein
    the antenna device is compatible with the first communication system and the second communication system; and
    the first coil antenna and the second coil antenna are allocated depending on a length of the longest communication range required for the first communication system and the second communication system.

10. The wireless communication device according to claim 8, wherein the first coil antenna and the second coil antenna are positioned adjacent to each other such that coil surfaces of the first and second coil antennas are positioned in a same plane; and the first coil antenna and the second coil antenna are used in one communication system.

11. The wireless communication device according to claim 10, further comprising:

a common power supply circuit that supplies power to the first coil antenna and the second coil antenna; and a switch that selectively performs switching of a signal path between the first coil antenna and the second coil antenna and the power supply circuit.

12. The wireless communication device according to claim 8, further comprising a power supply coil that is configured to be in at least a magnetic field coupling relationship with at least one of the first coil antenna and the second coil antenna.

13. The wireless communication device according to claim 8, wherein the first communication system and the second communication system are communication systems that use a same frequency band.

14. The wireless communication device according to claim 8, wherein the first coil antenna and the second coil antenna are arranged such that the winding axis of the coil conductor of the first coil antenna is present in a plane that includes the winding axes of the two coil conductors of the second coil antenna.

15. The wireless communication device according to claim 8, wherein a region in which the first coil antenna is located and a region in which the second coil antenna is located are at least partially superposed with each other when seen in plan view from winding axis directions of the winding axes of the two coil conductors of the second coil antenna and the winding axis of the coil conductor of the first coil antenna.

16. The wireless communication device according to claim 8, wherein the first coil antenna and the second coil antenna are positioned adjacent to each other such that a coil surface of each of the first and second coil antennas are positioned in a same plane; and the first coil antenna and the second coil antenna are used in one communication system.

17. The wireless communication device according to claim 16, wherein the coil conductor of the first coil antenna is interposed between the two coil conductors of the second coil antenna.

* * * * *